United States Patent
Furuta et al.

(10) Patent No.: US 8,780,518 B2
(45) Date of Patent: *Jul. 15, 2014

(54) ELECTRONIC CONTROL DEVICE INCLUDING INTERRUPT WIRE

(75) Inventors: Takahiko Furuta, Kasugai (JP); Toru Itabashi, Anjo (JP); Yuuki Mikami, Kariya (JP); Naoki Tanimoto, Kariya (JP); Hiroaki Nakamura, Nagaokakyo (JP); Shigeki Nishiyama, Nagaokakyo (JP)

(73) Assignees: DENSO CORPORATION, Kariya (JP); Murata Manufacturing Co., Ltd., Kyoto-fu (KR)

( * ) Notice: Subject to any disclaimer, the term of this patent is extended or adjusted under 35 U.S.C. 154(b) by 221 days.

This patent is subject to a terminal disclaimer.

(21) Appl. No.: 13/362,251

(22) Filed: Jan. 31, 2012

(65) Prior Publication Data

US 2012/0200972 A1     Aug. 9, 2012

(30) Foreign Application Priority Data

Feb. 4, 2011   (JP) .................................. 2011-022926
Feb. 4, 2011   (JP) .................................. 2011-022929

(51) Int. Cl.
*H02H 5/00*   (2006.01)

(52) U.S. Cl.
USPC ........................................................ 361/104

(58) Field of Classification Search
USPC ........................................................ 361/104
See application file for complete search history.

(56) References Cited

U.S. PATENT DOCUMENTS

| | | |
|---|---|---|
| 2003/0048620 A1 | 3/2003 | Nishimura et al. |
| 2004/0184211 A1 | 9/2004 | Bender et al. |
| 2008/0239684 A1 | 10/2008 | Yamasaki |
| 2009/0256235 A1 | 10/2009 | Takaoka et al. |
| 2012/0200970 A1 | 8/2012 | Itabashi et al. |
| 2012/0200973 A1 | 8/2012 | Shiraishi et al. |
| 2012/0200974 A1 | 8/2012 | Mikami et al. |
| 2012/0201010 A1 | 8/2012 | Furuta et al. |

FOREIGN PATENT DOCUMENTS

| | | |
|---|---|---|
| JP | U-52-168254 | 12/1977 |
| JP | U-54-159163 | 11/1979 |

(Continued)

OTHER PUBLICATIONS

Office Action mailed Jul. 23, 2013 in the corresponding JP application No. 2013-002744, which is Division Application of JP No. 2011-022928 (English translation).

(Continued)

*Primary Examiner* — Stephen W Jackson
(74) *Attorney, Agent, or Firm* — Posz Law Group, PLC

(57) ABSTRACT

An electronic control device includes a substrate, a plurality of component-mounted wires disposed on the substrate, a plurality of electronic components mounted on the respective component-mounted wires, a common wire coupled with each of the electronic components, an interrupt wire coupled between one of the component-mounted wires and the common wire, and a heat release portion. The interrupt wire melts in accordance with heat generated by an overcurrent. The heat release portion is attached to the common wire and is disposed at a position where a wiring distance from the interrupt wire is shorter than a wiring distance between the interrupt wire and any of the electronic components except for one of the electronic components mounted on the one of the component-mounted wires.

26 Claims, 20 Drawing Sheets

(56) References Cited

FOREIGN PATENT DOCUMENTS

| | | |
|---|---|---|
| JP | U-54-177551 | 12/1979 |
| JP | 55-14731 | 1/1980 |
| JP | U-55-14730 | 1/1980 |
| JP | U-55-108776 | 7/1980 |
| JP | S62-107341 U | 7/1987 |
| JP | S64-013650 U | 1/1989 |
| JP | A-06-36675 | 2/1994 |
| JP | A-2000-003662 | 1/2000 |
| JP | A-2000-164992 | 6/2000 |
| JP | A-2001-076611 | 3/2001 |
| JP | A-2003-019933 | 1/2003 |
| JP | A-2004-158377 | 6/2004 |
| JP | A-2006-114606 | 4/2006 |
| JP | 2007095592 A | 4/2007 |
| JP | A-2007-311467 | 11/2007 |
| JP | A-2008-060381 | 3/2008 |

OTHER PUBLICATIONS

Office Action mailed Nov. 13, 2012 in corresponding JP Application No. 2011-022929 (and English translation).
Office Action mailed Nov. 13, 2012 in corresponding JP Application No. 2011-022926 (and English translation).
Office Action mailed Nov. 13, 2012 in corresponding JP Application No. 2011-022925 (and English translation).
Office Action mailed Nov. 19, 2013 in the corresponding JP application No. 2013-001731, which is the Divisional Application of JP No. 2011-022927.
Office Action mailed Jul. 2, 2013 issued in corresponding JP patent application No. 2011-022929 (and English translation).
Office Action mailed Jul. 2, 2013 issued in corresponding JP patent application No. 2011-022925 (and English translation).
Office Action mailed Jul. 2, 2013 issued in corresponding JP patent application No. 2011-022931 (and English translation).
Office Action mailed Sep. 17, 2013 in corresponding JP Application No. 2013-002745 (and English translation).
Office Action mailed Nov. 13, 2012 in corresponding JP Application No. 2011-022924 (and English translation).
Office Action mailed Nov. 13, 2012 in corresponding JP Application No. 2011-022931 (and English translation).
Office Action mailed Nov. 13, 2012 in corresponding JP Application No. 2011-022927 (and English translation).
Office Action mailed Nov. 13, 2012 in corresponding JP Application No. 2011-022928 (and English translation).
Office Action mailed Nov. 13, 2012 in corresponding JP Application No. 2011-022930 (and English translation).
Office Action dated Mar. 5, 2014 issued in the corresponding CN patent application No. 2012100252747 (and English translation).

ELECTRONIC CONTROL DEVICE INCLUDING INTERRUPT WIRE

CROSS REFERENCE TO RELATED APPLICATIONS

The present application is based on and claims priority to Japanese Patent Applications No. 2011-22929 filed on Feb. 4, 2011, and No. 2011-22926 filed on Feb. 4, 2011, the disclosure of which is incorporated herein by reference.

TECHNICAL FIELD

The present invention relates to an electronic control device including an interrupt wire for overcurrent protection.

BACKGROUND

Conventionally, an electronic control device includes a fuse in case of a fault in the electronic control device. In an electronic control device in which small components are densely arranged, because a short-circuit current generated at a short-circuit fault in the small components does not reach a high current, it takes a long time to interrupt by the fuse. Especially when a large fuse is used for protecting a plurality of electronic control devices so as to reduce the number of fuses and a cost, it takes a longer time. Thus, temperatures of the components may be increased at an interruption and a voltage drop in a power supply wire and the like may be caused for a long time. In contrast, in a common wire, such as a power supply wire (e.g., a battery path and a ground path), that supplies electric power required for operating many circuits and many components mounted in accordance with advancement and diversification of electronic control, a relatively high current flows. Thus, an interrupting current of a large fuse disposed in a common wire path is further increased, and the electronic control device does not secure a sufficient interruption performance at a short-circuit fault in each circuit or each component. The above-described issue becomes noticeable, for example, in an electronic control device for a vehicle used at a higher temperature and including many mounted devices.

JP-A-2007-311467 discloses a printed circuit board control device in which an interrupt wire is disposed in a power supply wire in each substrate. If an overcurrent flows, the interrupt wire melts and the power supply wire is interrupted in each substrate or each device.

On a substrate in which components are densely mounted, a component-mounted wire, such as a land, on which an electronic component is mounted, and a common wire shared by the electronic component and a plurality of other electronic components are disposed adjacent to each other. Thus, heat generated at melting of the interrupt wire may be transmitted to the other electronic components through the common wire and the heat may have adverse effects on other electronic components. For example, a solder that couples the common wire and one of the electronic components may be melt by the heat.

In addition, on a substrate in which components are densely mounted, a wire, such as a land, on which an electronic component is mounted, and a plurality of other electronic components are disposed adjacent to each other. Thus, when an interrupt wire is simply provided to the wire, high temperature generated at the interrupt wire by an overcurrent may be transmitted to the adjacent electronic components, for example, via the substrate, and the adjacent electronic components may be subjected to the high temperature. As a result, adverse effects such as a decrease in performance and a decrease in life may be caused in the adjacent electronic components. In particular, in cases where characteristics of the electronic components change with temperature, the electronic components may operate abnormally.

SUMMARY

In view of the foregoing problems, it is an object of the present invention to provide an electronic control device which can restrict influence of heat generated at an interrupt wire on electronic components.

An electronic control device according to a first aspect of the present invention includes a substrate, a plurality of component-mounted wires, a plurality of electronic components, a common wire, an interrupt wire, and a heat release portion. The component-mounted wires are disposed on the substrate. The electronic components mounted on the respective component-mounted wires. The common wire is disposed on the substrate and coupled with each of the electronic components. The interrupt wire is coupled between one of the component-mounted wires and the common wire. The interrupt wire melts in accordance with heat generated by an overcurrent so as to interrupt a connection between the one of the component-mounted wires and the common wire via the interrupt wire. The heat release portion is attached to the common wire and is made of the same material as the common wire. The heat release portion is disposed at a position where a wiring distance from the interrupt wire is shorter than a wiring distance between the interrupt wire and any of the electronic components except for one of the electronic components mounted on the one of the component-mounted wires.

In the electronic control device according to the first aspect, when the heat generated at the interrupt wire by the overcurrent is transmitted to the common wire, the heat is released from the heat release portion attached to the common wire. Thus, the electronic control device can restrict influence of the heat generated at the interrupt wire on the electronic components except for the electronic component mounted on the component-mounted wire coupled with the interrupt wire.

An electronic control device according to a second aspect of the present invention includes a substrate, a wire, an electronic component, an interrupt wire, a protected electronic component, and a heat diffusion wire. The wire is disposed on the substrate. The electronic component is coupled with the wire. The interrupt wire is coupled between the electronic component and the wire. The interrupt wire melts in accordance with heat generated by an overcurrent so as to interrupt a connection between the electronic component and the wire via the interrupt wire. The protected electronic component is disposed on the substrate. The heat diffusion wire is disposed adjacent to the interrupt wire. The heat diffusion wire diffuses the heat by the overcurrent throughout the heat diffusion wire and stores the heat so as to protect the protected electronic component against the heat.

In the electronic control device according to the second aspect, when the heat generated at the interrupt wire by the overcurrent reaches the heat diffusion wire, the heat is diffused throughout the heat diffusion wire and is stored in the heat diffusion wire. Thus, the electronic control device can restrict influence of the heat generated at the interrupt wire on the protected electronic component.

BRIEF DESCRIPTION OF THE DRAWINGS

Additional objects and advantages of the present invention will be more readily apparent from the following detailed description when taken together with the accompanying drawings. In the drawings.

DETAILED DESCRIPTION (First Embodiment)

Figure 1:
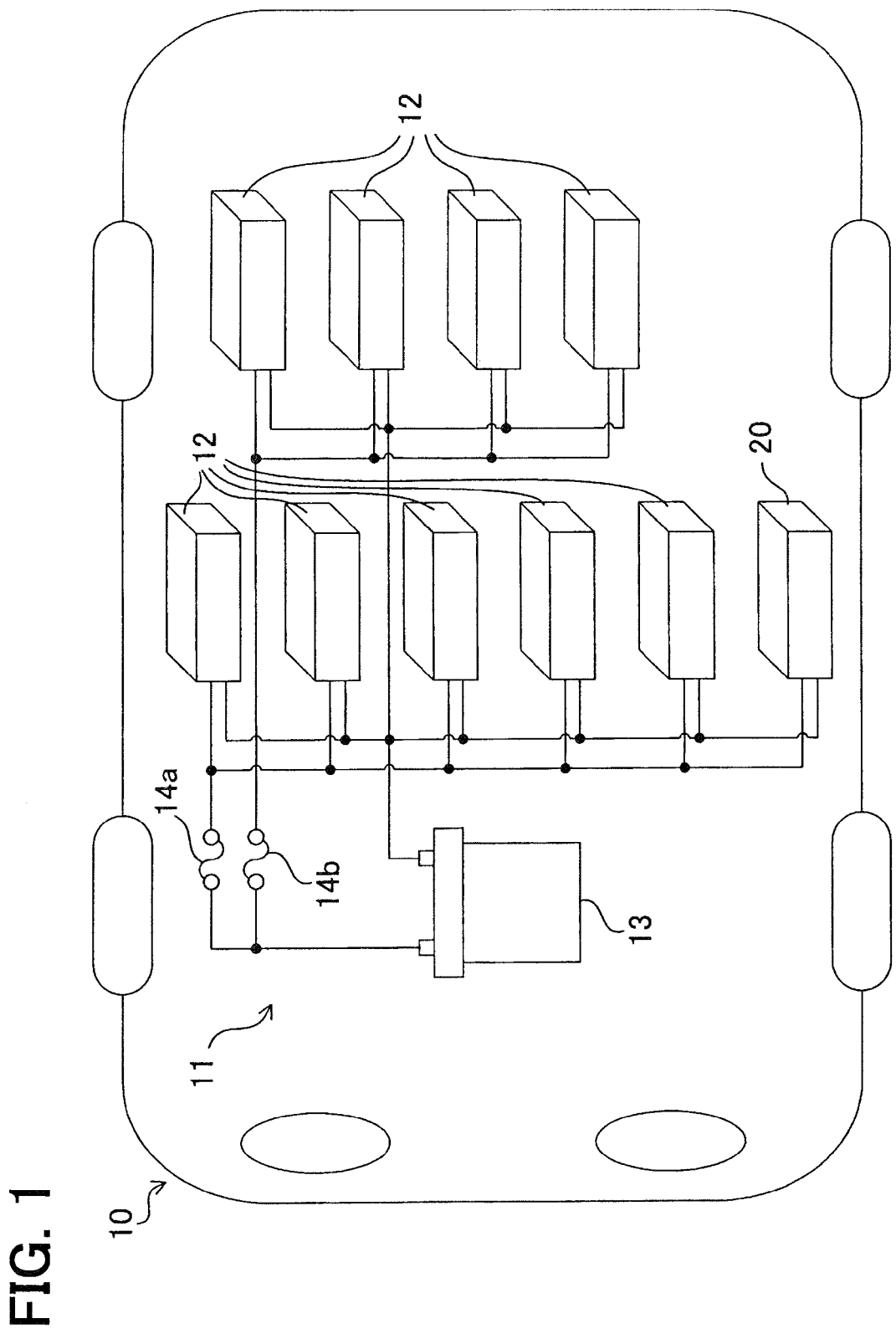
FIG. 1 is a block diagram showing a vehicle control system including a traction control device according to a first embodiment of the present disclosure.

An electronic control device according to a first embodiment of the present disclosure will be described with reference to drawings. The electronic control device according to the present embodiment can be suitably used as a traction control device 20 included in a vehicle control system 11. As shown in FIG. 1, the vehicle control system 11 includes a plurality of electronic control devices 12 that include the traction control device 20, an engine electronic control unit (ECU), a brake ECU, a steering ECU, a body ECU, a navigation device, and the like.

The traction control device 20 restricts an acceleration slip of a driving wheel. In a vehicle control such as a running control, the traction control device 20 is less important than other electronic control devices.

The electronic control devices 12 including the traction control device 20 are electrically coupled with a battery 13 via one of fuses 14a, 14b used for overcurrent protection. The battery 13 is a direct-current power source. Because each of the fuses 14a, 14b is disposed on a power supply path for supplying electric power to many electronic control devices, each of the fuses 14a, 14b may be a large fuse for 15 A or 20 A. When one of the electronic control devices 12 coupled with the fuse 14a has abnormality and an overcurrent greater than a predetermined current value is generated, the fuse 14a blows out by the overcurrent, and a power supply via the fuse 14a is interrupted. Thus, an adverse influence to the other electronic control devices 12 can be restricted. In an example shown in FIG. 1, each of the electronic control devices 12 is electrically coupled with the battery 13 via one of the fuses 14a, 14b. However, all the electronic control devices 12 may also be electrically coupled with the battery 13 via a single fuse, or each of the electronic control devices 12 may also be electrically coupled with the battery 13 via one of more than two fuses.

The traction control device 20 according to the present embodiment will be described with reference to FIG. 2. The traction control device 20 includes a circuit substrate 21 housed in a casing (not shown). On the circuit substrate 21, a plurality of electronic components 22 for restricting an acceleration slip is densely-mounted on the circuit substrate 21. The circuit substrate 21 is electrically coupled with an external device and other electronic control devices 12 via, for example, a connector, and restricts an acceleration slip of the driving wheel based on a predetermined signal.

Each of the electronic components 22 on the circuit substrate 21 is electrically coupled with a power supply wire 23 that supplies electric power from the battery 13 to each of the electronic components 22. Thus, the power supply wire 23 can operate as a common wire shared by the electronic components 22.

Figure 2:
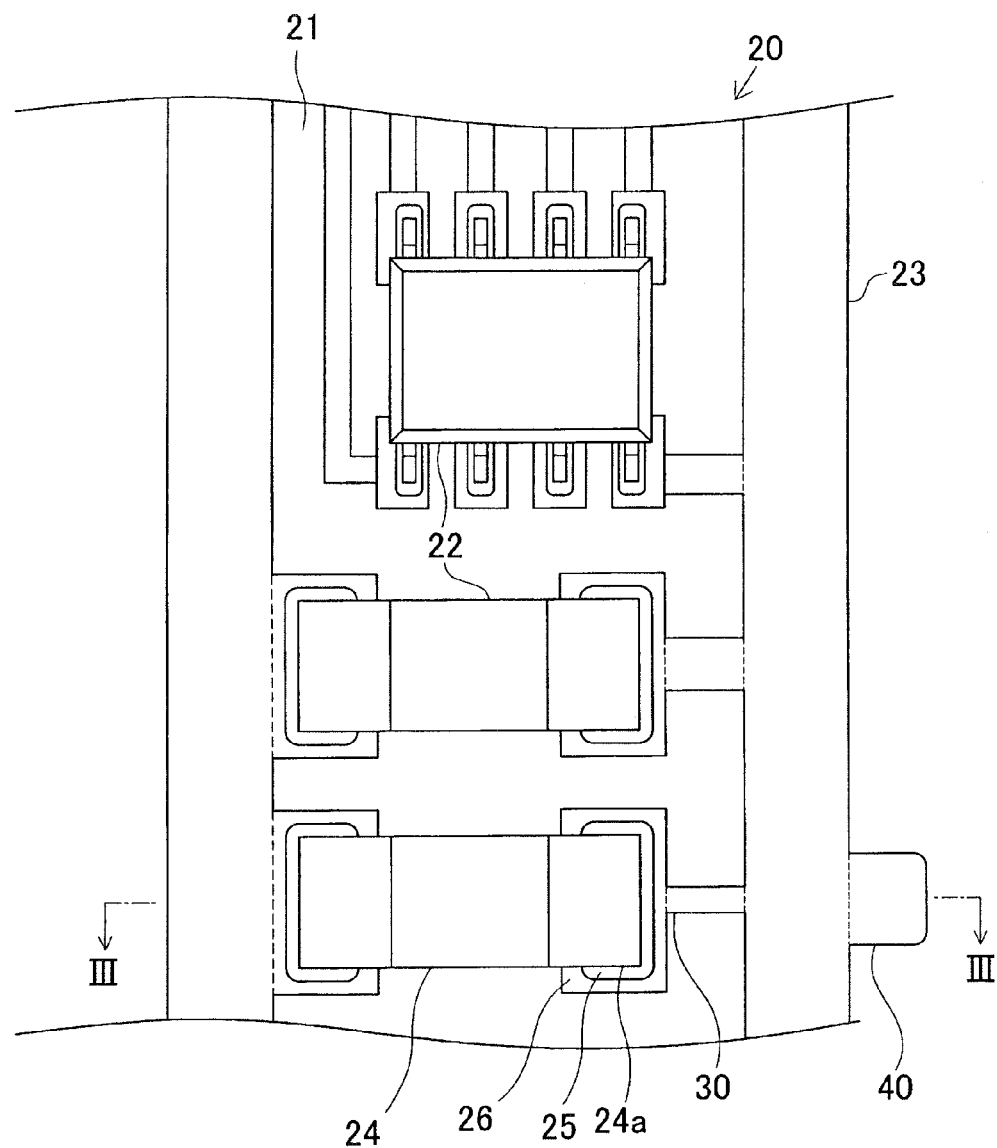
FIG. 2 is a diagram showing a part of the traction control device according to the first embodiment.
Figure 3:
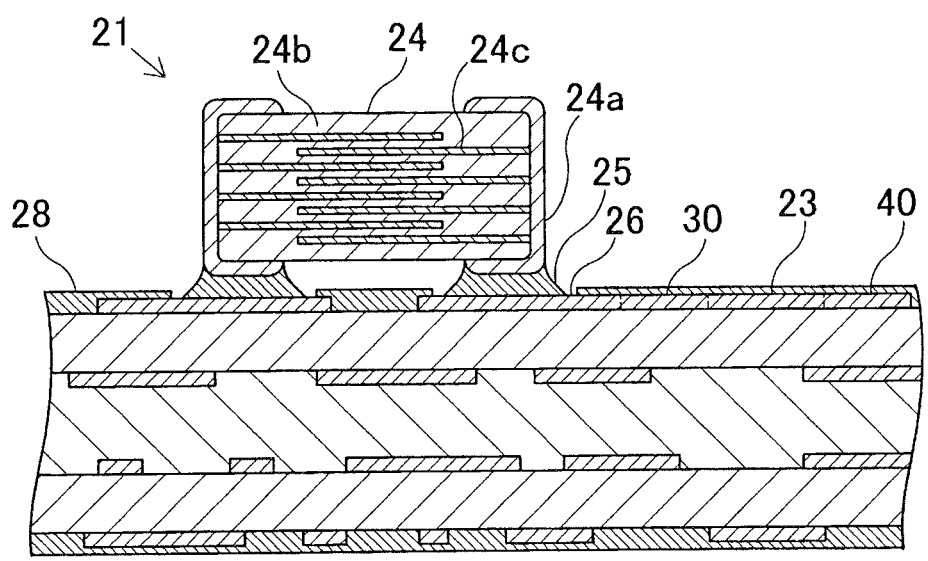
FIG. 3 is a cross-sectional view of the traction control device taken along line III-III in FIG. 2.

As shown in FIG. 2 and FIG. 3, one of the electronic components 22 on the circuit substrate 21 is a ceramic capacitor 24. The ceramic capacitor 24 may be formed by stacking high-permittivity ceramic dielectric bodies 24b made of barium titanate and internal electrodes 24c in layers for improving temperature characteristics and frequency characteristics, and thereby achieving a large capacity with a small size.

The ceramic capacitor 24 includes an outside electrode 24a that is coupled with a land 26 through a solder 25. Between the land 26 and the power supply wire 23, an interrupt wire 30 is disposed. The interrupt wire 30 melts by heat generated by an overcurrent and interrupts electric connection between the land 26 and the power supply wire 23 via the interrupt wire 30. Thus, the interrupt wire 30 can achieve an overcurrent protection depending on the circuit substrate 21.

The interrupt wire 30 has a wire width sufficiently smaller than a wire width of the power supply wire 23. The wire width means a dimension in a direction that is perpendicular to a direction of electric current on a surface of the circuit substrate 21. For example, the interrupt wire 30 has a wire width within a range from 0.2 mm to 0.3 mm and the power supply wire 23 has a wire width of 2 mm. The lands 26 can work as examples of a component-mounted wire. On the surface of the circuit substrate 21 except for a part including the land 36, a solder resist layer 28 is provided as a protective layer.

As shown in FIG. 2, the power supply wire 23 is coupled with a heat release wire 40 made of the same material as the power supply wire 23. In other words, the hear release wire 40 is attached to the power supply wire 23. A wiring distance between the interrupt wire 30 and the heat release wire 40 is shorter than a wiring distance between the interrupt wire and any of the electronic components except for the electronic component 22 (i.e., the ceramic capacitor 24) mounted on the land 26 coupled with the interrupt wire. The heat release wire 40 increase a heat release area so as to release heat transmitted though the power supply wire 23.

In the traction control device 20 having the above-described configuration, for example, when a short-circuit fault occurs in the ceramic capacitor 24 and an overcurrent flows in the interrupt wire 30, the interrupt wire 30 generates heat in accordance with the overcurrent. When the generated heat becomes greater than a predetermined temperature, the interrupt wire 30 melts, and the electric connection via the interrupt wire 30 is interrupted. Accordingly, the other electronic components 22 coupled with the power supply wire 23 can be protected against the overcurrent. The current at interruption is not high enough to blow the fuse 14a. Thus, the damage of the traction control device 20 does not influence to the other electronic control devices 12 supplied with power via the fuse 14a. A time from generation of the overcurrent to the melting of the interrupt wire 30 is a few milliseconds, and a melting time of each of the fuses 14a, 14b is generally about 0.02 seconds. Thus, the overcurrent protection can be appropriately achieved even to an electronic control device or an electronic component required to improve a processing speed.

In the traction control device according to the present embodiment, when heat generated at the interrupt wire 30 by an overcurrent is transmitted to the power supply wire 23, the heat is transmitted to the heat release wire 40 and is released. Thus, the heat is less likely to be transmitted to the other electronic components 22 coupled with the power supply wire 23. Thus, influence of heat, which is generated at the interrupt wire 30 disposed on the substrate in which components are densely mounted, to the other electronic components 22 can be restricted.

The power supply wire 23 is coupled with the battery 13, which supplies power not only to the traction control device 20 but also to other electronic control devices 12, by the power supply path, and the fuse 14a for protecting the traction control device 20 and other electronic control devices 12 is disposed on the power supply path. Even when a short-circuit fault occurs in the traction control device 20 including the interrupt wire 30, the interrupt wire 30 melts. Thus, influence of the short-circuit fault on the power supply to other electronic control devices 12 can be restricted.

Figure 4:
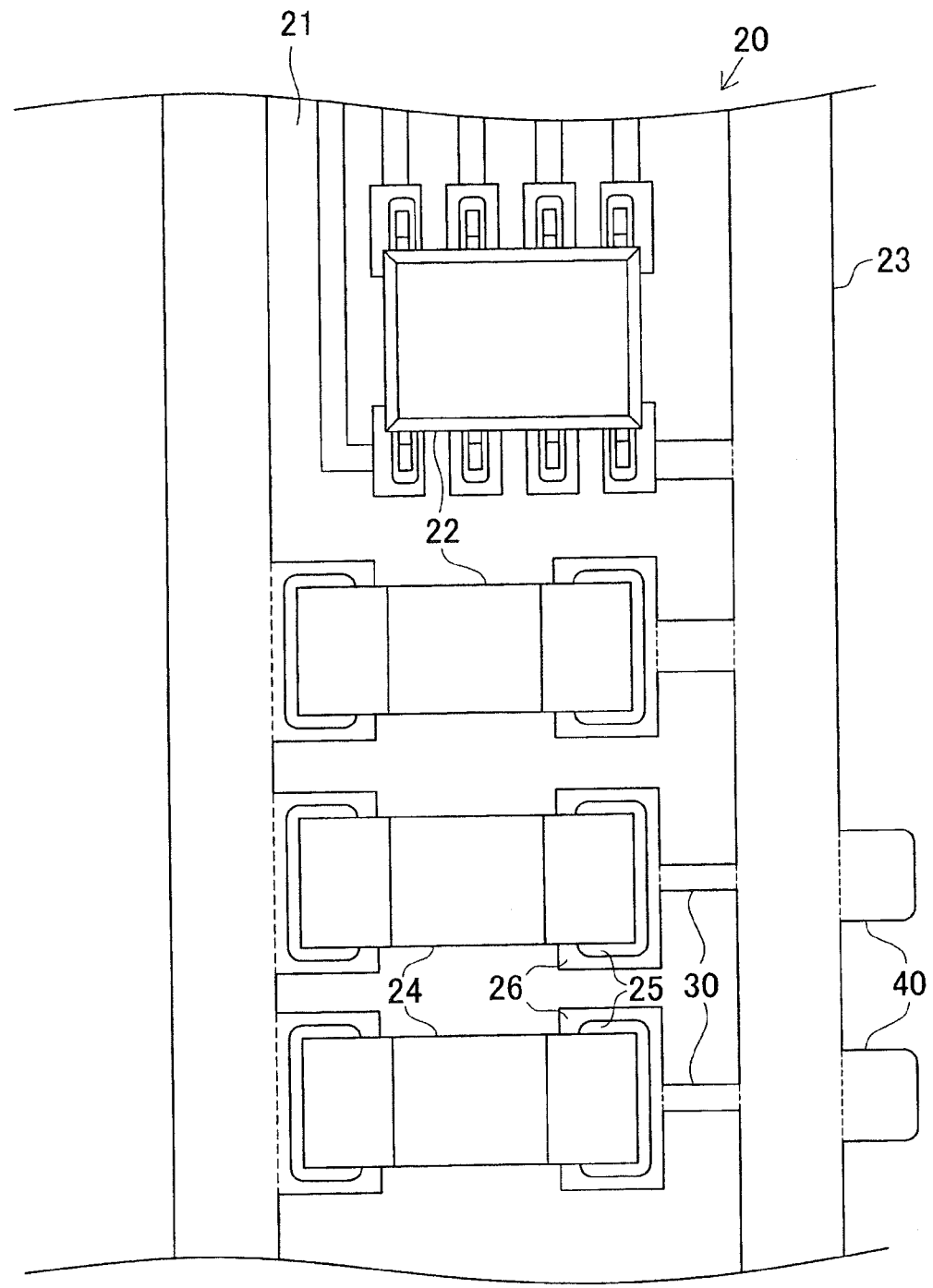
FIG. 4 is a diagram showing a part of a traction control device according to a first modification of the first embodiment.

A traction control device 20 according to a first modification of the first embodiment will be described with reference to FIG. 4. As shown in FIG. 4, the traction control device 20 may include a plurality of interrupt wires 30 so as to correspond to a plurality of electronic components (e.g., ceramic capacitors 24 in the present modification). In addition, the traction control device 20 may further include a plurality of heat release wires 40 at positions where a wiring distance from the corresponding interrupt wire 30 is shorter than a wiring distance between the corresponding interrupt wire 30 and any of the electronic components 22 except for the electronic component 22 (the ceramic capacitor 24) mounted on the land 26 coupled with the corresponding interrupt wire 30.

In other words, the traction control device 20 may include a first interrupt wire, a second interrupt wire, a first heat release portion, and a second heat release portion. The first interrupt wire is coupled with a first one of the component-mounted wires (the land 26) on which a first one of the electronic components 22 (the ceramic capacitor 24) is mounted. The second interrupt wire is coupled with a second one of the component-mounted wires (the land 26) on which a second one of the electronic components 22 (the ceramic capacitor 24) is mounted. The first heat release portion is disposed at a position where a wiring distance from the first interrupt wire is shorter than a wiring distance between the first interrupt wire and any of the electronic components 22 except for the first one of the electronic components (the ceramic capacitor 24). The second heat release portion is disposed at a position where a wiring distance from the second interrupt wire is shorter than a wiring distance between the second interrupt wire and any of the electronic components except for the second one of the electronic components (the ceramic capacitor 24).

Accordingly, even when a plurality of interrupt wires 30 is provided, influence of heat generated at each interrupt wire 30 on the other electronic components 22 can be restricted.

Figure 5:
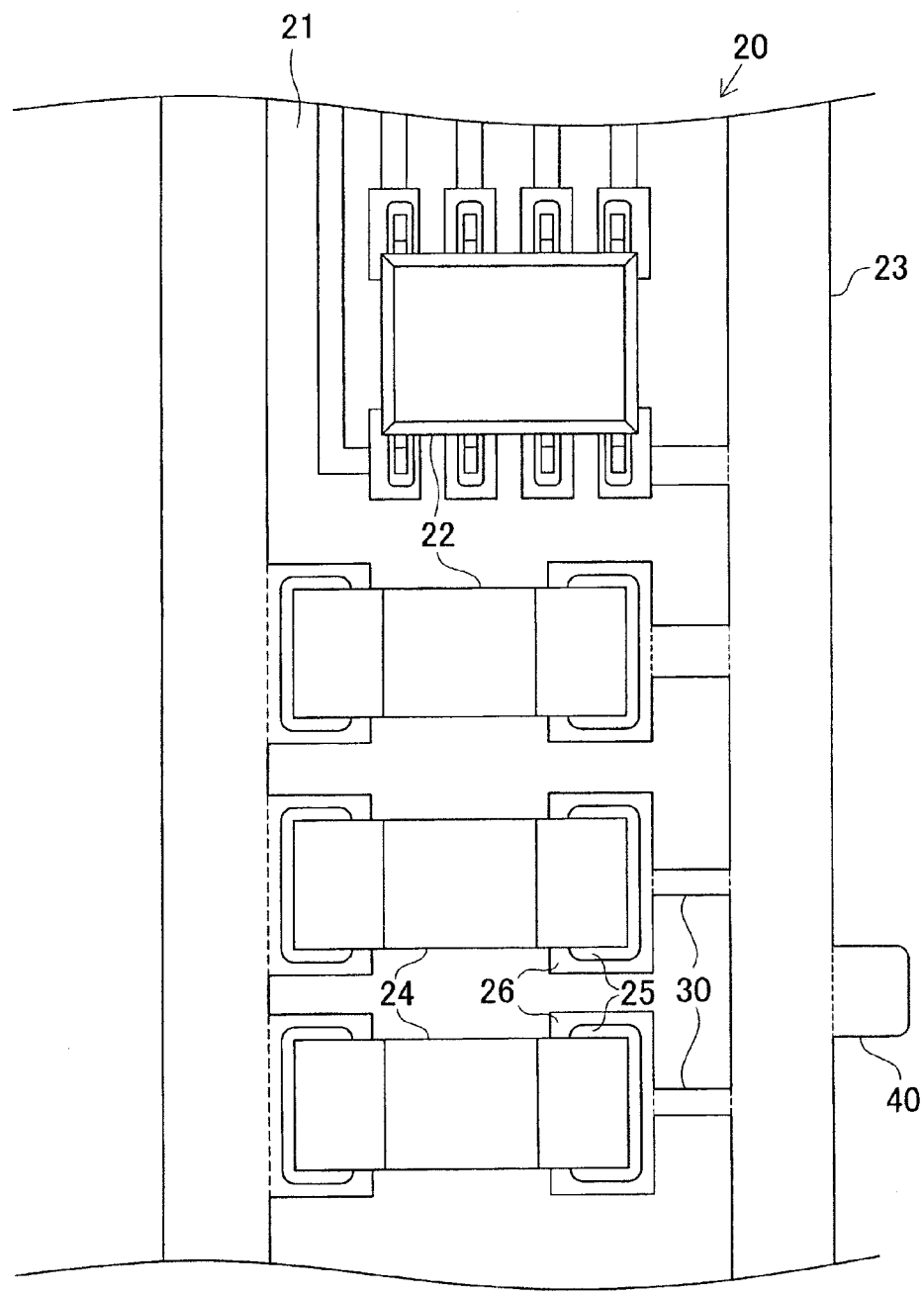
FIG. 5 is a diagram showing a part of a traction control device according to a second modification of the first embodiment.

A traction control device 20 according to a second modification of the first embodiment will be described with reference to FIG. 5. As shown in FIG. 5, the traction control device 20 may include two interrupt wires 30 depending on two electronic components (the ceramic capacitors 24 in the present modification) and may include one heat release wire 40. A wiring distance between each of the interrupt wires 30 and the heat release wire 40 is shorter than a wiring distance between each of the interrupt wires 30 and any of the electronic components 22 other than the electronic component 22 (the ceramic capacitor 24) mounted on the land 26 coupled with each of the interrupt wires 30.

In other words, the traction control device 20 may include a first interrupt wire, a second interrupt wire, and a heat release portion. The first interrupt wire is coupled with a first one of the component-mounted wires (the land 26) on which a first one of the electronic components 22 (the ceramic capacitor 24) is mounted. The second interrupt wire is coupled with a second one of the component-mounted wires (the land 26) on which a second one of the electronic components 22 (the ceramic capacitor 24) is mounted. The heat release portion is disposed at a position where a wiring distance from each of the first interrupt wire and the second interrupt wire is shorter than a wiring distance between each of the first interrupt wire and the second interrupt wire and any of the electronic components 22 except for the first one of the electronic components (the ceramic capacitor 24) and the second one of the electronic components (the ceramic capacitor 24).

Also in the present modification, an influence of heat generated at one of the interrupt wires 30 on the other electronic components 22 can be restricted by the one heat release wire 40. Even in a case where the traction control device 20 includes two interrupt wires 30, the traction control device 20 does not need to include the same number of heat release wires 40. Thus, an influence of heat generated atone of the interrupt wires 30 on other electronic components 22 can be restricted with using a limited space effectively. Although the traction control device 20 according to the present modification includes two interrupt wires 30, as an example, the traction control device 20 may also include three or more interrupt wires 30 depending on the electronic components 22 and one heat release wire 40 shared by the interrupt wires 30. In the present case, a wiring distance between each of the interrupt wires 30 and the heat release wire 40 is shorter than a wiring distance between each of the interrupt wires 30 and any of the electronic components 22 except for the electronic component 22 (the ceramic capacitor 24) mounted on the land 26 coupled with each of the interrupt wires 30.

Figure 6:
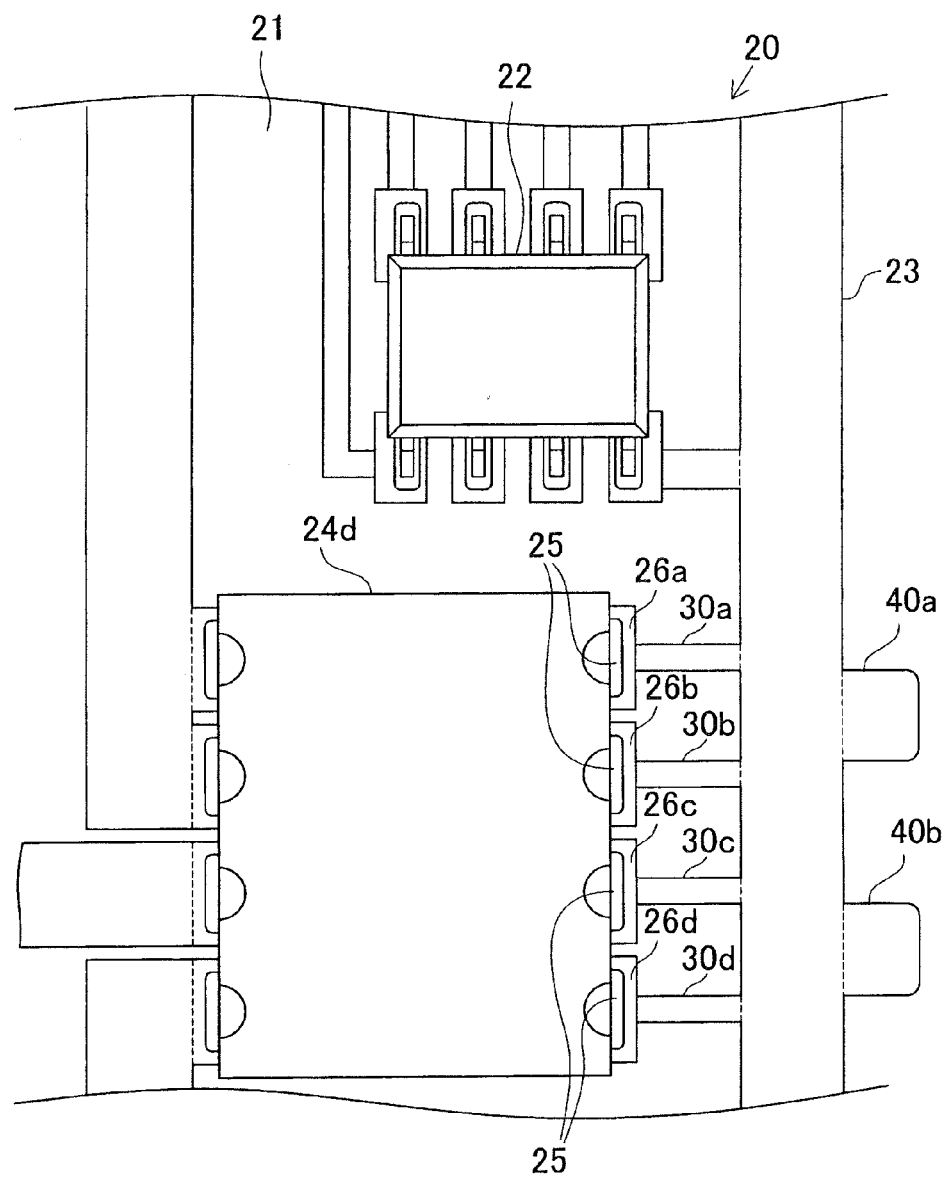
FIG. 6 is a diagram showing a part of a traction control device according to a third modification of the first embodiment.

A traction control device 20 according to a third modification of the first embodiment will be described with reference to FIG. 6. In the present modification, the traction control device 20 includes a ceramic capacitor 24d. The ceramic capacitor 24d has an array shape and includes a plurality of outside electrodes. Between the ceramic capacitor 24 and the power supply wire 23, interrupt wire 30a-30d are coupled. In the ceramic capacitor 24, four multilayer ceramic capacitors are packaged as a capacitor array. In the present modification, the interrupt wires 30a-30d couples and the power supply wire 23 and lands 26a-26d to which respective outside electrodes of the ceramic capacitor 24d are coupled.

The traction control device 20 further includes a heat release wire 40a and the heat release wire 40b coupled with the power supply wire 23. A wiring distance between each of the interrupt wires 30a, 30b and the heat release wire 40a is shorter than a wiring distance between each of the interrupt wires 30a, 30b and any of the electronic components 22 except for the ceramic capacitor 24d. A wiring distance between each of the interrupt wires 30c, 30d and the heat release wire 40b is shorter than a wiring distance between each of the interrupt wires 30c, 30d and any of the electronic components 22 except for the ceramic capacitor 24d. An influence of heat generated at one of the interrupt wires 30a, 30b on the other electronic components 22 can be restricted by the heat release wire 40a, and an influence of heat generated at one of the interrupt wires 30c, 30d on the other electronic components 22 can be restricted by the heat release wire 40b.

(Second Embodiment)

A traction control device 20a according to a second embodiment of the present disclosure will be described with reference to FIG. 7 and FIG. 8. The traction control device 20a includes a layer coupling portion 23a and a heat release member 42 disposed inside the layer coupling portion 23a as a heat release portion for releasing heat transmitted from an interrupt wire 30. The other configuration of the traction control device 20a according to the present embodiment is similar to the above-described configuration of the traction control device 20 according to the first embodiment. Thus, differences between the traction control device 20a and the traction control device 20 will be mainly described.

Figure 7:
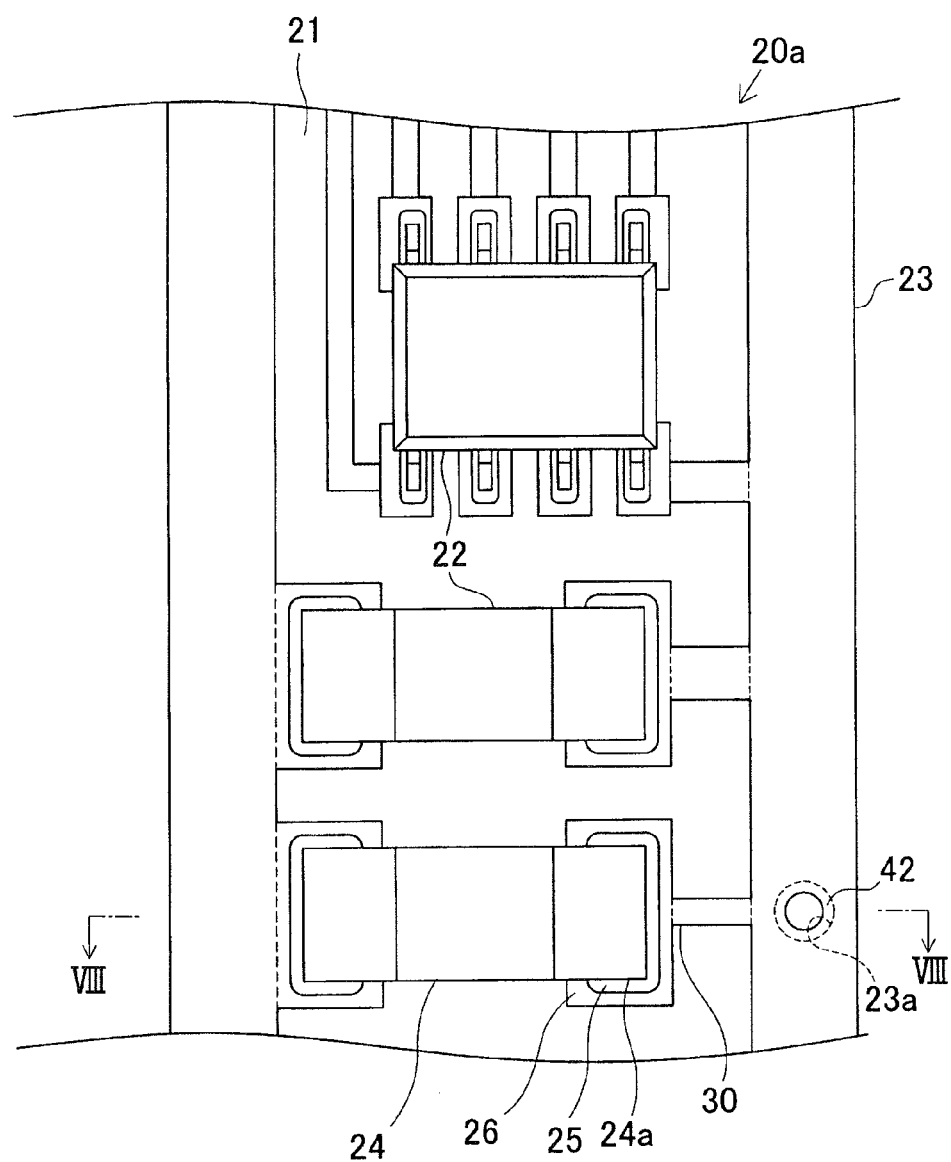
FIG. 7 is a diagram showing a part of a traction control device according to a second embodiment of the present disclosure.
Figure 8:
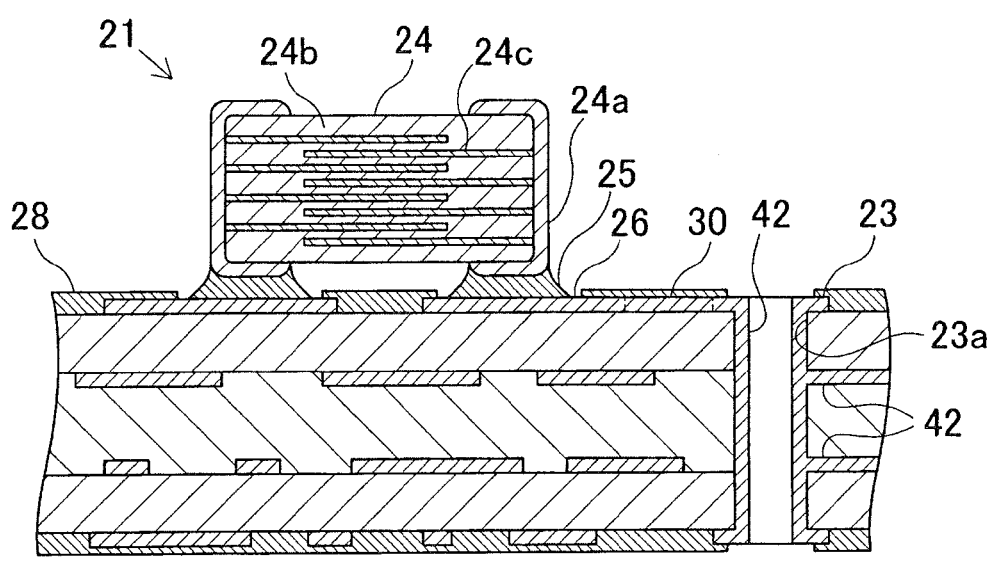
FIG. 8 is a cross-sectional view of the traction control device taken along line VIII-VIII in FIG. 7.

As shown in FIG. 7 and FIG. 8, a circuit substrate 21 defines a through hole, which works as the layer coupling portion 23a, at a portion of the power supply wire 23. The heat release member 42 is made of the same material as the power supply wire 23. The heat release member 42 includes a portion disposed on an inner wall of the layer coupling portion 23a. The heat release member 42 further includes a portion disposed on a rear surface of the circuit substrate 21 opposite to a surface of the circuit substrate 21 on which the power supply wire 23 is disposed and a portion disposed inside the circuit substrate 21. The portions of the heat release member 42 are in contact with each other via the layer coupling portion 23a.

Accordingly, even when components are densely mounted on the circuit substrate 21, the heat release member 42 can secure a large heat release area. The through hole shown in FIG. 7 and FIG. 8 is an example of the layer coupling portion 23a that couples wires on the surfaces of the circuit substrate 21 and wires between layers and a configuration of the layer coupling portion 23a is not limited to the through hole.

Figure 9:
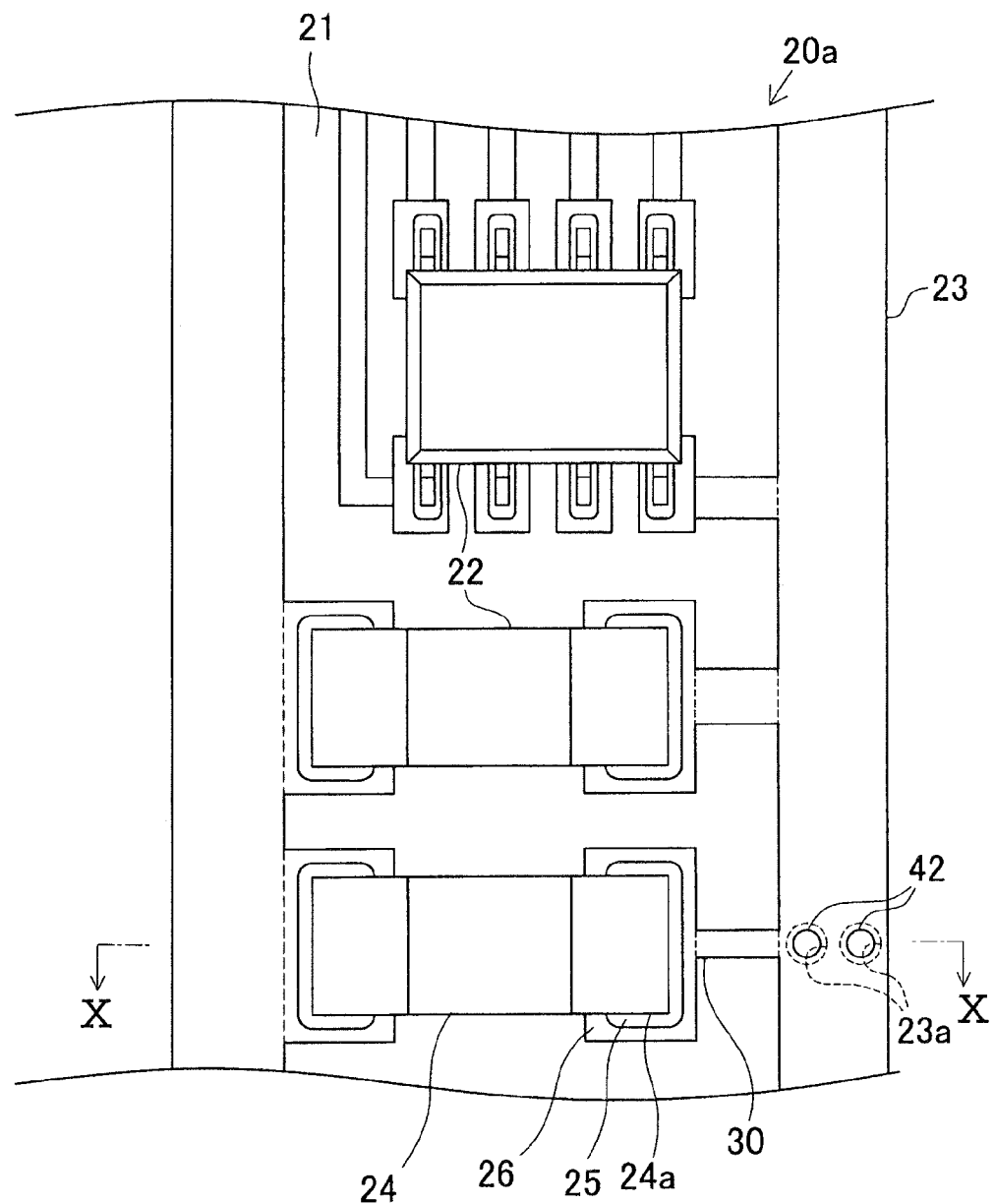
FIG. 9 is a diagram showing a traction control device according to a modification of the second embodiment.
Figure 10:
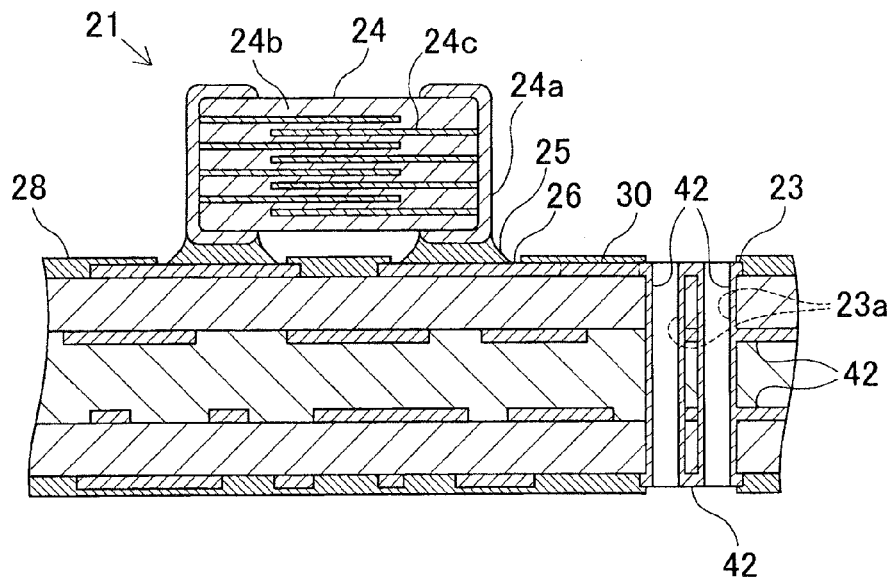
FIG. 10 is a cross-sectional view of the traction control device taken along line X-X in FIG. 9.

A traction control device 20a according to a modification of the second embodiment will be described with reference to FIG. 9 and FIG. 10. The traction control device 20a according to the modification includes a plurality of through holes as a layer coupling portion 23a and a heat release member 42 disposed on inner walls of the through holes. For example, two through holes are defined at portions of the power supply wire 23 by the circuit substrate 21, and a portion of the heat release member 42 made of the same material as the power supply wire 23 is disposed on the inner walls of the through hole. The heat release member 42 further includes a portion disposed on the rear surface of the circuit substrate 21 and a portion disposed inside the circuit substrate 21. The portions of the heat release member 42 are in contact with each other via the layer coupling portion 23a.

Accordingly, even when components are densely mounted on the circuit substrate 21, the heat release member 42 can secure a large heat release area with certainty. The number of through holes that work as the layer coupling portion 23a may also be more than two, and the heat release member 42 may also be disposed on an inner wall of each of the through holes. Also in this case, the heat release member 42 may be disposed on the rear surface of the circuit substrate 21 and the inside of the circuit substrate 21 and may be coupled with each other via the through holes so as to increase the heat release area. The above-described configurations of the layer coupling portion 23a and the heat release member 42 may be applied to other embodiments and modifications.

(Third Embodiment)

A traction control device 20b according to a third embodiment of the present disclosure will be described with reference to FIG. 11. The traction control device 20b according to the present embodiment includes an interrupt wire 30e. The power supply wire 23 is disposed between lands 26 coupled with respective outside electrodes 24a of the ceramic capacitor 24. The other configuration of the traction control device 20b according to the present embodiment is similar to the above-described configuration of the traction control device 20 according to the first embodiment. Thus, differences between the traction control device 20b and the traction control device 20 will be mainly described.

The interrupt wire 30e includes a first wire section 31 and second wire section 32 that is shorter than the first wire section 31. The first wire section 31 and the second wire section 32 are coupled to each other at a predetermined angle. The predetermined angle is determined in such a manner that the first wire section 31 is coupled with the power supply wire 23 and the second wire section 32 is coupled with the land 26. For example, the predetermined angle is 90 degrees. The heat release wire 40 is made of the same material as the power supply wire 23. A wiring distance between the interrupt wire 30e and the heat release wire 40 is shorter than a wiring distance between the interrupt wire 30e and any of the electronic components 22 except for the electronic component 22 (i.e., the ceramic capacitor 24) coupled with the interrupt wire 30e.

By bending the interrupt wire 30e at the predetermined angle, a wire length of the interrupt wire 30e can be increased compared with a case where the interrupt wire 30e has a straight shape while coupling the power supply wire 23 and the land 26. Accordingly, a required wire length of the interrupt wire 30e can be secured in a limited mounting area even when the interrupt wire 30e is disposed on the surface of the circuit substrate 21 on which the electronic components 22 are densely mounted. Thus, an influence of heat generated at the interrupt wire 30*e* on the other electronic components 22 can be restricted, and a size of the traction control device 20*b* can be reduced.

Figure 11:
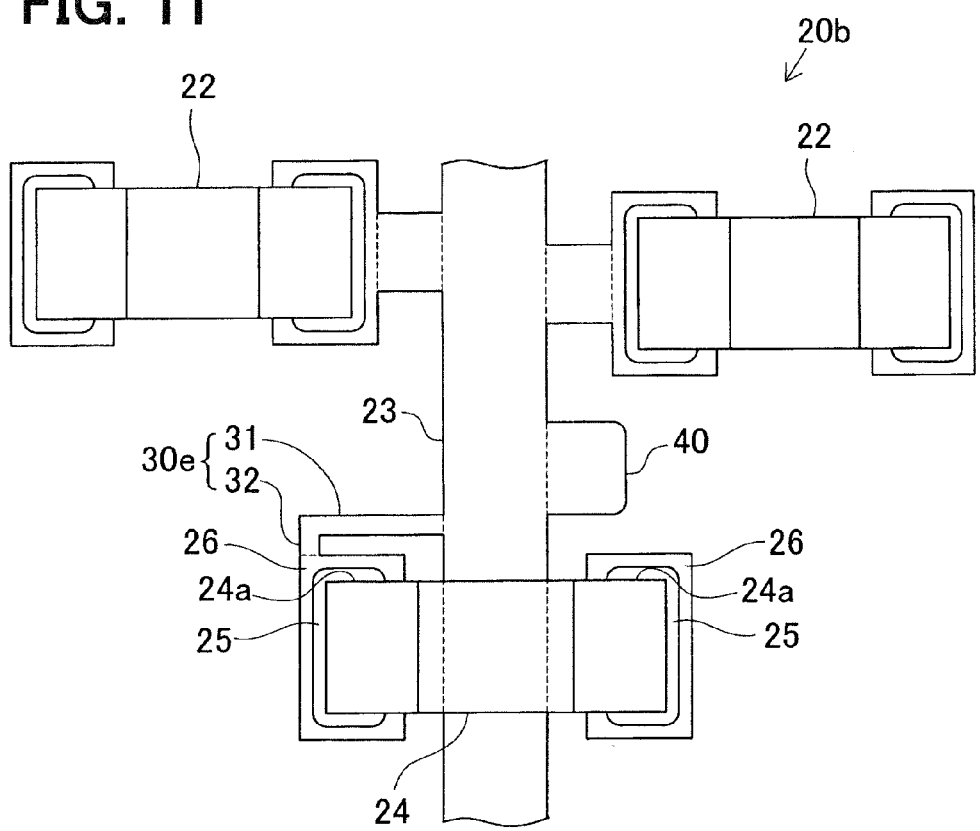
FIG. 11 is a diagram showing a traction control device according to a third embodiment of the present disclosure.

In the traction control device 20*b* shown in FIG. 11, the first wire section 31 is coupled with the power supply wire 23, and the second wire section 32 is coupled with land 26. Alternatively, the first wire section 31 may be coupled with the land 26 and the second wire section 32 may be coupled with the power supply wire 23. The predetermined angle may be changed in accordance with positions of the power supply wire 23 and the land 26. Instead of the heat release wire 40, the layer coupling portion 23*a* (e.g., a through hole) and the heat release member 42 disposed on the inner wall of the layer coupling portion 23*a* may be disposed. The configuration of the interrupt wire 30*e* in which the first wire section 31 and the second wire section 32 are coupled at the predetermined angle may be applied to other embodiments and modifications.

(Fourth Embodiment)

A traction control device 20*c* according to a fourth embodiment of the present disclosure will be described with reference to FIG. 12. In the traction control device 20*c* according to the present embodiment, a surface of the circuit substrate 21 is covered by a solder resist layer 28. The solder resist layer 28 defines an opening portion 28*a* through which at least a part of the interrupt wire 30 is exposed outside. The other configuration of the traction control device 20*c* according to the present embodiment is similar to the above-described configuration of the traction control device 20 according to the first embodiment. Thus, differences between the traction control device 20*c* and the traction control device 20 will be mainly described.

Figure 12:
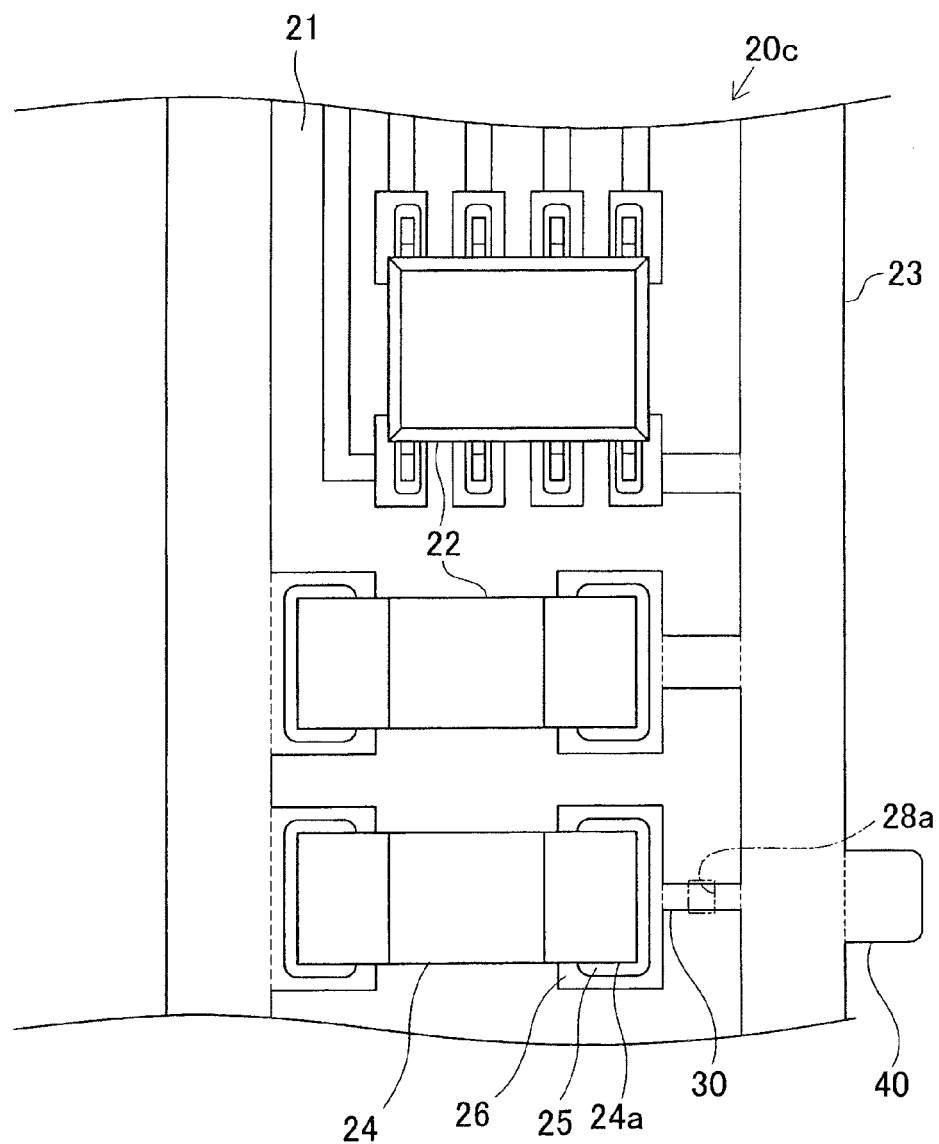
FIG. 12 is a diagram showing a traction control device according to a fourth embodiment of the present disclosure.

As shown in FIG. 12, the solder resist layer 28 defines the opening portion 28*a* so that a center portion of the entire length of the interrupt wire 30, which is most likely to generate heat, is exposed outside. Reasons of providing the opening portion 28*a* will be described with reference to FIG. 13 and FIG. 14.

Figure 13:
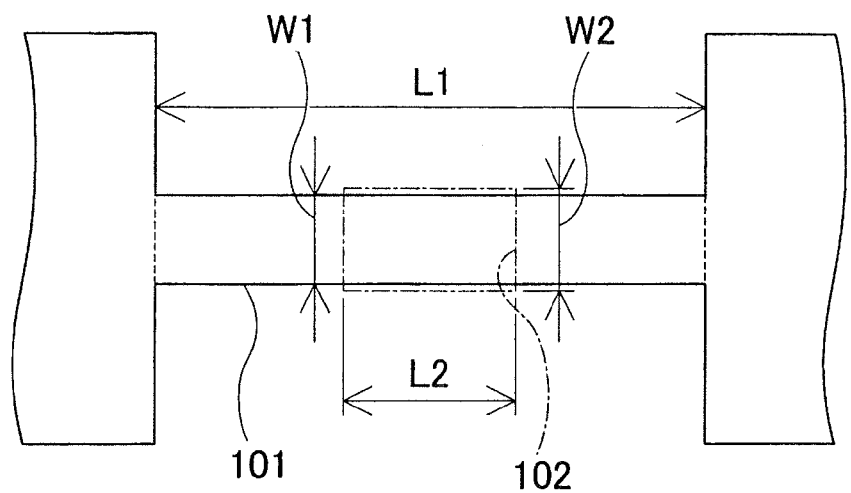
FIG. 13 is a diagram showing a device including a test interrupt wire and a test opening portion.

In a device shown in FIG. 13, a part of a test interrupt wire 101 is exposed outside through a test opening portion 102 defined by a solder resist layer. The test interrupt wire 101 is supplied with a predetermined current, and an interrupting current I with which the test interrupt wire 101 melts and a melting time t when the test interrupt wire 101 melts are measured. Furthermore, an interrupting current I and a melting time t of a test interrupt wire 101 in a case where a solder resist layer does not define a test opening portion 102 are also measured. The test interrupt wire 101 has an entire length L1 of 2.85 mm and has a width W1 of 0.25 mm. The test opening portion 102 has an opening length L2 of 0.6 mm in a direction parallel to a length direction of the test interrupt wire 101 and has an opening width W2 of 0.25 mm in a width direction of the test interrupt wire 101. In FIG. 10, the opening width W2 is drawn as being longer than the width W1 for convenience of drawing.

Figure 14:
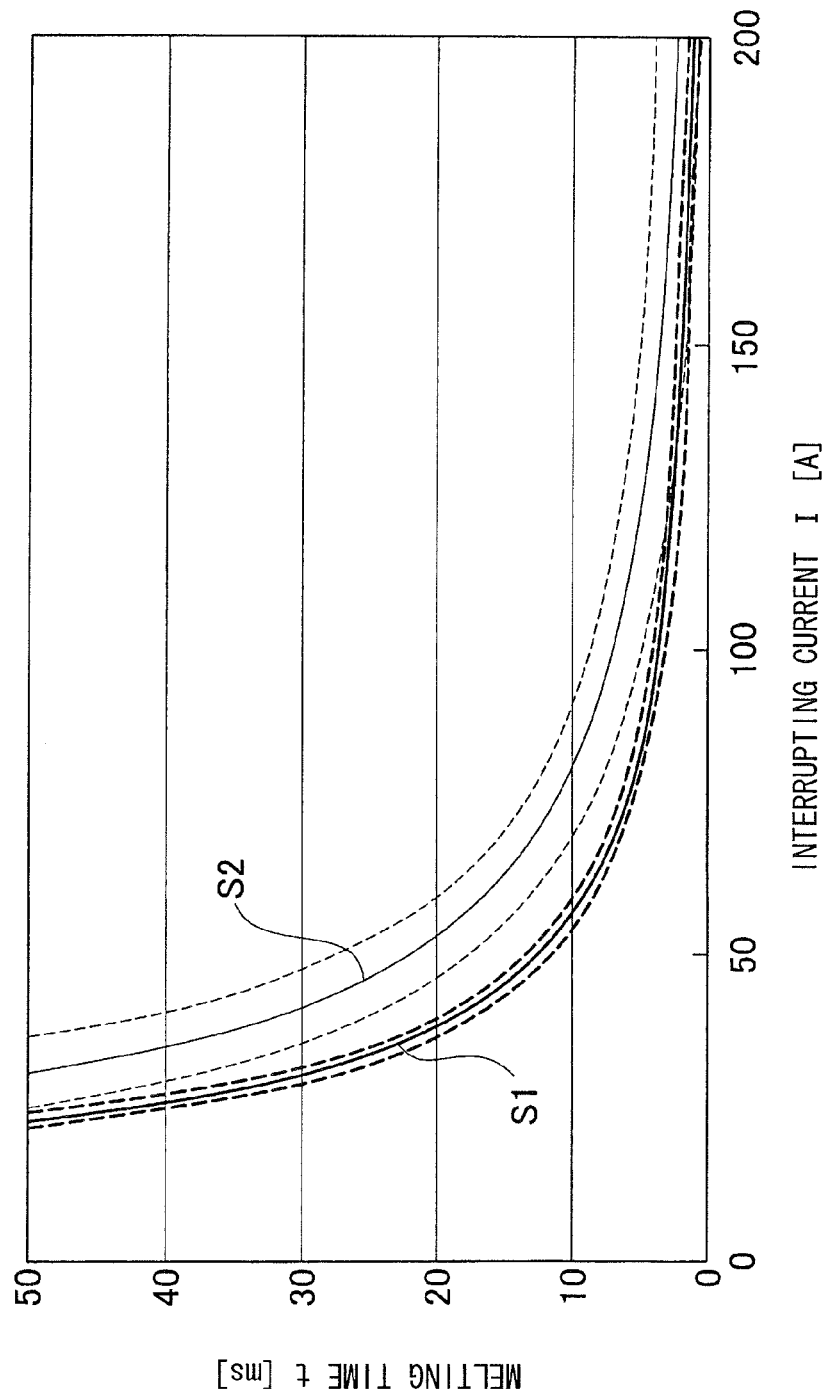
FIG. 14 is a graph showing a relationship between an interrupting current and a melting time of the test interrupt wire in each case where the test opening portion is defined and where test opening portion is not defined.

In FIG. 14, a bold solid line S1 shows a relationship between the interrupting current I and the melting time t of the test interrupt wire 101, a part of which is exposed through the test opening portion 102, and a range between bold dashed lines centered on the bold solid line S1 shows a variation range of the melting time t with respect to the interrupting current I. A thin solid line S2 shows a relationship between the interrupting current I and the melting time t of the test interrupt wire 101 in a case where a test opening portion 102 is not defined, and a range between thin dashed lines centered on the thin solid line S2 shows a variation range of the melting time t with respect to the interrupting current I.

As shown in FIG. 14, at the same interrupting current, the melting time t decreases and the variation range decreases when the test opening portion 102 is defined by the solder resist layer. In contrast, in the case where the test opening portion 102 is not defined by the solder resist layer, the melting time t of the test interrupt wire 101 increases in each overcurrent range and the variation range increases compared with the case where the test opening portion 102 is defined. This is because a melt conductor generated by melting of the test interrupt wire 101 flows from the test opening portion 102 and the melt conductor is less likely to stay at a position of the test interrupt wire 101 before melting.

Thus, when at least a part of the interrupt wire 30 is exposed through the opening portion 28*a*, the melting time t decreases, the overcurrent protection action can be achieved early, and a temperature rise of a protected component can be restricted. Furthermore, a time for which a voltage of the power supply wire 23 decreases due to interruption by the interrupt wire 30 can be reduced. In addition, because the variation of the melting time t decreases, a capacity of a stabilizing capacitor that is designed in view of the melting time of the interrupt wire 30 in each device or each circuit can be reduced, and a cost and a size can be reduced. Furthermore, because the melting time t decreases also in a rated region of current, a circuit can be designed more freely.

Thus, when the interrupt wire 30 melts in accordance with heat generated by the overcurrent, a melt conductor generated by melting of the interrupt wire 30 flows from the opening portion 28*a*. Accordingly, the melt conductor is less likely to stay at a position of the interrupt wire 30 before melting, variations in the melt position and the melting time due to stay of the melt conductor can be restricted, and a decrease in interruption performance by the interrupt wire 30 can be restricted.

In the traction control device 20*c* shown in FIG. 12, the solder resist layer 28 defines the opening portion 28*a* so as to expose the center portion of the interrupt wire 30, which is likely to melt. The solder resist layer 28 may also define an opening portion so as to expose other portion of the interrupt wire 30 or the whole top surface of the interrupt wire 30. The above-described configuration of the opening portion 28*a* through which at least a part of the interrupt wire 30 is exposed may be applied to other embodiments and modifications.

Figure 15:
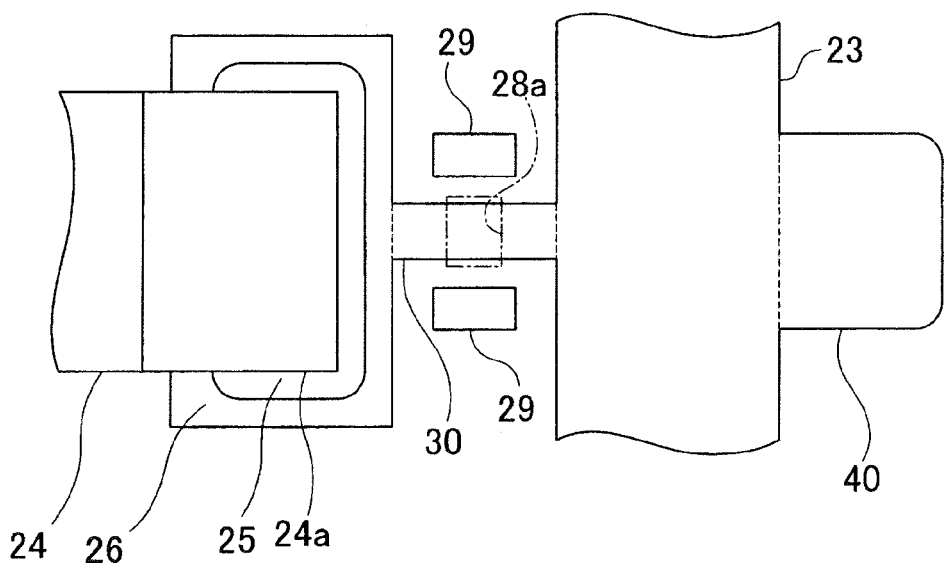
FIG. 15 is a diagram showing a part of a traction control device according to a modification of the fourth embodiment.

A traction control device 20*c* according to a modification of the fourth embodiment will be described with reference to FIG. 15. As shown in FIG. 15, the traction control device 20*c* according to the present modification includes an adherent wire 29 disposed adjacent to the interrupt wire 30. The adherent wire 29 can work as an adherent portion to which a melt conductor generated by melting of the interrupt wire 30 adheres. The adherent wire 29 may be made of the same material as the power supply wire 23. For example, a pair of adherent wires 29 is disposed to opposite sides of the interrupt wire 30. When the melt conductor of the high temperature is generated at melting of the interrupt wire 30, the melt conductor flow on the surface of the circuit substrate 21 and adheres to the adherent wire 29 adjacent to the interrupt wire 30.

Accordingly, the melt conductor is held by the adherent wire 29 and loses flowability by releasing heat and being hardened. Thus, a decrease in interrupt performance by the interrupt wire 30 can be restricted, and influence of the flow of the melt conductor on the other electronic components can be restricted. The adherent wire 29 may be disposed with respect to the interrupt wire 30, a part of which is exposed outside through the opening portion 28a. The adherent wire 29 may also be disposed with respect to the interrupt wire 30 whose surface is fully covered by the solder resist layer 28 without the opening portion 28a. Also in this case, similar advantages can be achieved.

(Fifth Embodiment)

Figure 16:
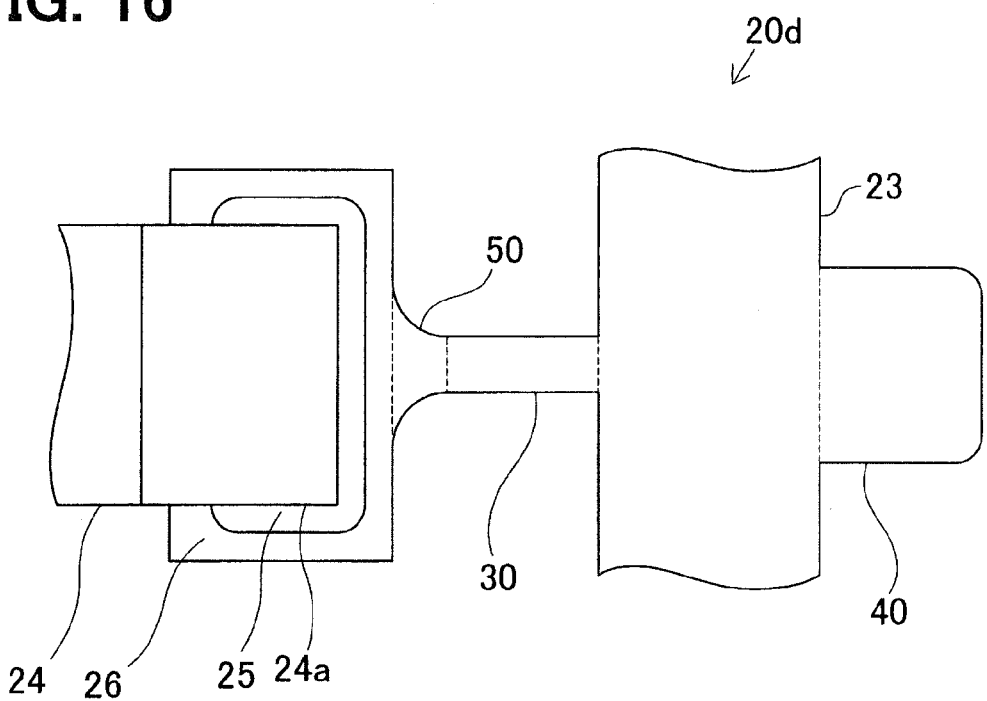
FIG. 16 is a diagram showing a part of a traction control device according to a fifth embodiment of the present disclosure.

A traction control device 20d according to a fifth embodiment of the present disclosure will be described with reference to FIG. 16.

In the present embodiment, an end of the interrupt wire 30 is electrically coupled with the land 26 via a connection wire 50. The other configuration of the traction control device 20d according to the present embodiment is similar to the above-described configuration of the traction control device 20 according to the first embodiment. Thus, differences between the traction control device 20d and the traction control device 20 will be mainly described.

A wire width of the connection wire 50 increases toward the land 26 in an arc manner (R-shape) so that the a cross-sectional area of an end portion the connection wire 50 coupled with the interrupt wire 30 is smaller than a cross-sectional area of the other end portion of the connection wire 50 coupled with the land 26, which is a connection object. Thus, a side end of the connection wire 50 is smoothly connected with a side of the interrupt wire 30, and the wire width of the connection wire 50 gradually increases toward the land 26.

When heat generated at the interrupt wire 30 by overcurrent is transmitted to the land 26 through the connection wire 50, heat required for melting the interrupt wire 30 is not absorbed excessively to the land 26 compared with a case where the heat is directly transmitted to the land 26. Accordingly, a variation in temperature rise in the interrupt wire 30 can be restricted, and thereby the decrease in interrupt performance of the interrupt wire 30 can be restricted. In particular, the heat generated at the interrupt wire 30 by the overcurrent is gradually diffused in the connection wire 50 and is widely transmitted to the land 26. Thus, a local temperature rise in the land 26 can be restricted. Therefore, even when a solder having a relatively low melting point is used to the land 26, the solder is less likely to be melted by the heat from the interrupt wire 30. Also in a steady state in which an overcurrent does not flow, heat generated by electric current that flows in the interrupt wire 30 can be diffused via the connection wire 50. Thus, a temperature of the interrupt wire 30 can be appropriately controlled in the steady state, and a long-term reliability can be improved.

Because the side end of the interrupt wire 30 and the side end of the connection wire 50 are smoothly connected with each other, when the interrupt wire 30 and the connection wire 50 are formed using etching liquid, the etching liquid can uniformly flow at a connection portion of the side end of the interrupt wire 30 and the side end of the connection wire 50. Accordingly, the etching liquid is less likely to stay at the connection portion and a variation in wire width of the interrupt wire can be restricted. Thus, the decrease in interrupt performance by the interrupt wire 30 can be restricted.

The connection wire 50 may also be disposed between the interrupt wire 30 and the power supply wire 23. The above-described configuration of the connection wire 50 may be applied to other embodiments and modifications.

(Sixth Embodiment)

A traction control device 220 according to a sixth embodiment of the present disclosure will be described with reference to FIG. 17 to FIG. 19. The traction control device 220 includes a circuit substrate 221 housed in a casing (not shown). On the circuit substrate 221, a plurality of electronic components for restricting acceleration slips are densely mounted. The circuit substrate 221 is electrically coupled with an external device and the other electronic control devices 12 through, for example, a connector, and restricts acceleration slips of the driving wheel based on a predetermined signal.

Figure 17:
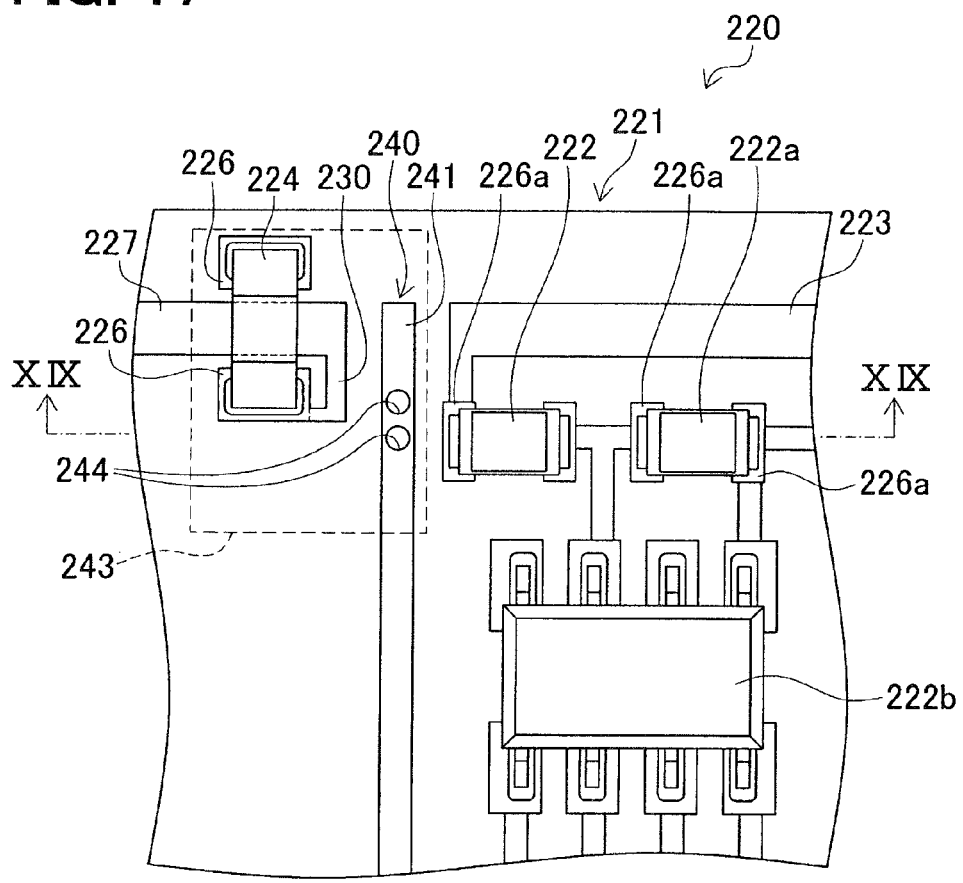
FIG. 17 is a diagram showing a part of a traction control device according to a sixth embodiment of the present disclosure.

As shown in FIG. 17, the electronic components including a ceramic capacitor 224 and an oscillator 222 and a plurality of copper wires including a power supply wire 223 and a common wire 227 are densely mounted on the surface of the circuit substrate 221.

Figure 18:
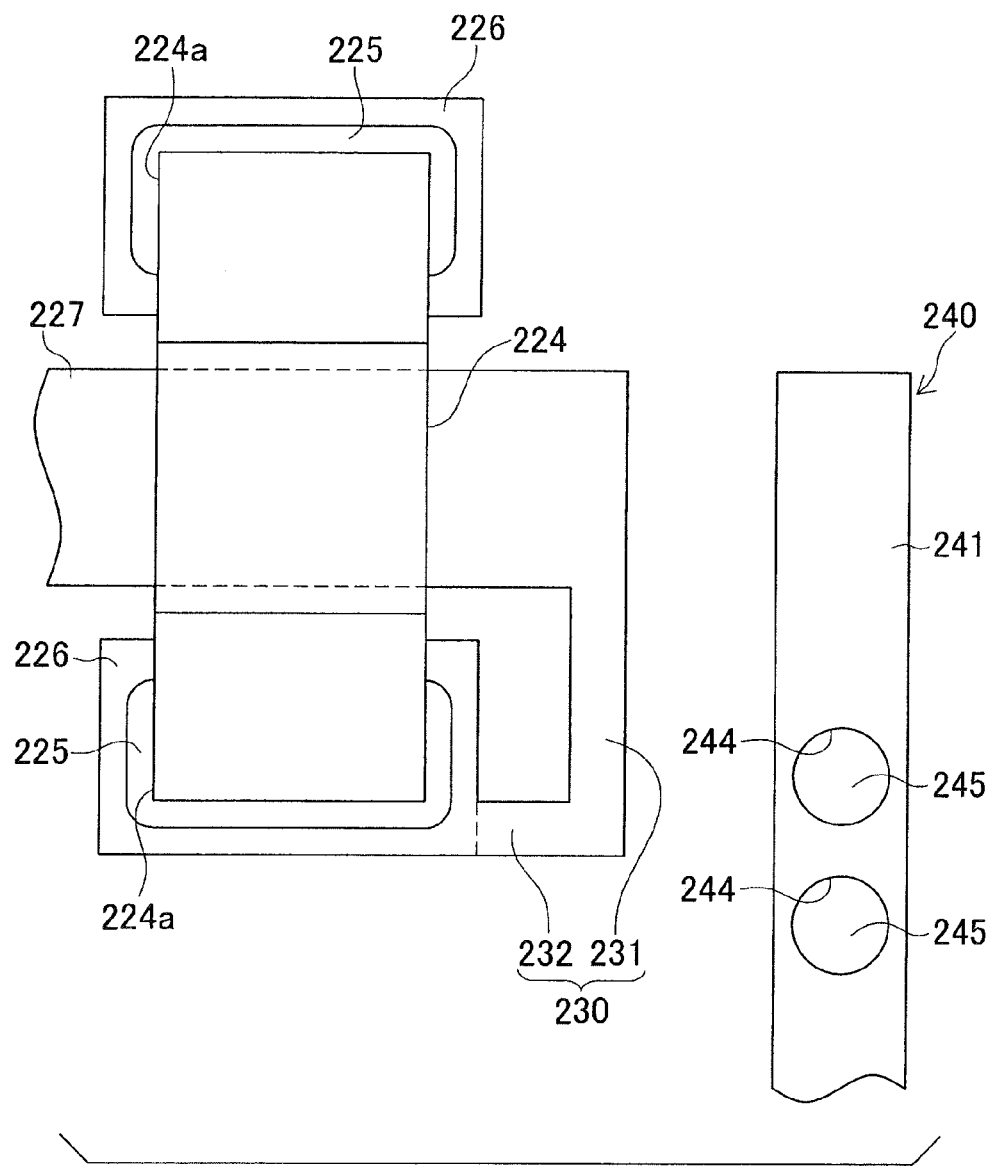
FIG. 18 is an enlarged view of a part of the traction control device according to the sixth embodiment.

As shown in FIG. 18, the ceramic capacitor 224 includes outside electrodes 224a. The outside electrodes 224a are respectively coupled with lands 226, which are provided as a part of the wire of the circuit substrate 221, via a solder 225. Accordingly, the ceramic capacitor 224 is mounted on the surface of the circuit substrate 221. The ceramic capacitor 224 may be formed by stacking high-permittivity ceramic dielectric bodies made of barium titanate and internal electrodes in layers for improving temperature characteristics and frequency characteristics, and thereby achieving a large capacity with a small size.

The common wire 227 is coupled with many circuits and may electronic components (not shown) and is shared by the circuits and the electronic components. In order to achieve a densely mounting, the common wire 227 is disposed between the lands 226 coupled with the ceramic capacitor 224. Between one of the lands 226 and the common wire 227, the interrupt wire 230 is disposed. The interrupt wire 230 melts by heat generated by an overcurrent and interrupts electric connection between the land 226 and the common wire 227 via the interrupt wire 230. Thus, the interrupt wire 230 can achieve an overcurrent protection depending on the circuit substrate 221.

The interrupt wire 230 includes a first wire section 231 and a second wire section 232 shorter than the first wire section 231. The first wire section 231 and the second wire section 232 are coupled with each other in such a manner that the interrupt wire 230 has an L-shape. The first wire section 231 is coupled with an end portion of the common wire 227 and the second wire section 232 is coupled with one of the lands 226. The interrupt wire 230 has a wire width sufficiently smaller than a wire width of the common wire 227. The wire width means a dimension in a direction that is perpendicular to a direction of electric current on a surface of the circuit substrate 221. For example, the interrupt wire 230 has a wire width within a range from 0.2 mm to 0.3 mm and the common wire 227 has a wire width of 2 mm.

The oscillator 222 is mounted on the surface of the circuit substrate 221 in a manner similar to the ceramic capacitor 224. The oscillator 222 is coupled with lands 226a through a solder, and thereby the oscillator 222 is coupled with the power supply wire 223. The oscillator 222 is used as a part of an oscillation circuit for synchronizing operation of the whole circuit. In the vicinity of the oscillator 222, other electronic components 222a, 222b are mounted on the surface of the circuit substrate 221. The oscillator 222 and the electronic components 222a, 222b are examples of a protected electronic component.

Figure 19:
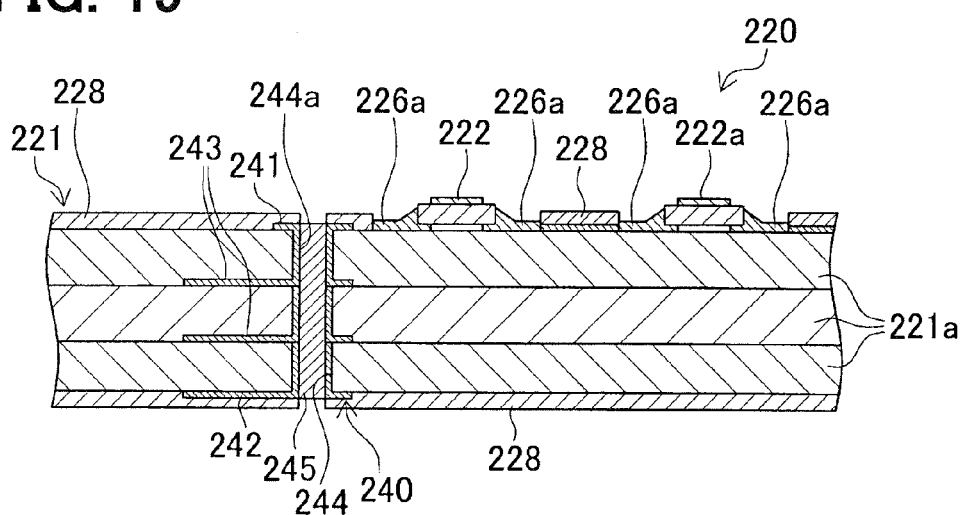
FIG. 19 is a cross-sectional view of the traction control device taken along line XIX-XIX in FIG. 17.

As shown in FIG. 19, the circuit substrate 221 may be a multilayer circuit in which three insulating layers 221a and four conductive layers are stacked. The insulating layers 221a may be made of a glass cloth in which epoxy resin is impregnated with epoxy resin. The conductive layers may be made of conductive material, such as copper, as a part of the wires of the circuits. The wires including common wire 227 and the interrupt wire 230 are formed as a part of an outermost conductive layer in the four conductive layers. Both surfaces of the circuit substrate 221 are covered by a solder resist layer 228. In the following description, a side of the circuit substrate 221 on which the ceramic capacitor 224 and the interrupt wire 230 are disposed is referred to as an upper side, and an opposite side of the circuit substrate 221 from the upper side is referred to as a lower side.

The circuit substrate 221 further includes a heat diffusion wire 240. The heat diffusion wire 240 is made of copper in a manner similar to the common wire 227. The heat diffusion wire 240 includes outer wire layers 241, 242, inner wire layers 243, and a pair of through holes 244 via which the outer wire layers 241, 242 and the inner wire layers 243 are thermally coupled with each other. The outer wire layer 241 on the upper side is covered by the solder resist layer 228 in a manner similar to the common wire 227. The outer wire layer 241 has a predetermined wire width. The outer wire layer 241 is disposed between a region where the ceramic capacitor 224 and the interrupt wire 230 are disposed and a region where the oscillator 222 and the electronic components 222a, 222b are disposed. The outer wire layer 241 extends straight so as to divide the regions.

The inner wire layers 243 are respectively disposed between a middle insulation layer 221a and an upper insulation layer 221a and between the middle insulation layer 221a and a lower insulation layer 221a. Each of the inner wire layers 243 has a rectangular planar shape and a surface area of each of the inner wire layers 243 is larger than a surface area of the outer wire layer 241. The shape and the size of the inner wire layers 243 are determined so that the inner wire layers 243 do not overlap the protected electronic components, such as the oscillator 222, adjacent to the ceramic capacitor 224 and the interrupt wire 230 in a vertical direction, that is, a thickness direction of the circuit substrate 221.

The outer wire layer 242 is disposed on the lower side of the circuit substrate 221 and is covered by a solder resist layer 228. The outer wire layer 242 has the same shape and the same size as the inner wire layers 243. The inner wire layers 243 and the outer wire layer 242 are located under the interrupt wire 230 and the ceramic capacitor 224 (a region shown by dashed line in FIG. 17). A part of the inner wire layers 243 and a part of the outer wire layer 242 overlap the interrupt wire 230 and the ceramic capacitor 224 in the thickness direction of the circuit substrate 221.

The pair of through holes 244 is defined between the interrupt wire 230 and the oscillator 222. The pair of through holes 244 penetrates the circuit substrate 221 from the outer wire layer 241 on the upper side to the outer wire layer 242 on the lower side through the inner wire layers 243. On an inner wall of each of the through holes 244, an inner-wall wire 244a made of copper is disposed. The inner-wall wire 244a is integrated with the outer wire layers 241, 242 and the inner wire layers 243. Each of the through holes 244 is filled with a filler 245 made of, for example, copper paste. The filler 245 increases a heat-transfer efficiency between the outer wire layers 241, 242 and the inner wire layers 243.

In the traction control device 220 having the above-described configuration, for example, when a short-circuit fault occurs in the ceramic capacitor 224 and an overcurrent flows in the interrupt wire 230, the interrupt wire 230 generates heat in accordance with the overcurrent. When the generated heat becomes greater than a predetermined temperature, the interrupt wire 230 melts, and the electric connection via the interrupt wire 230 is interrupted. Accordingly, the other electronic components coupled with the common wire 227 can be protected against the overcurrent. The current at interruption is not high enough to blow the fuse 14a. Thus, the damage of the traction control device 220 does not influence to the other electronic control devices 12 supplied with power via the fuse 14a. A time from generation of the overcurrent to the melting of the interrupt wire 230 is a few milliseconds, and a melting time of each of the fuses 14a, 14b is generally about 0.02 seconds. Thus, the overcurrent protection can be appropriately achieved even to an electronic control device or an electronic component required to improve a processing speed.

When the ceramic capacitor 224 is damaged and a short circuit is caused, not only the interrupt wire 30 but also the ceramic capacitor 224 may generate heat by an overcurrent. The heat generated at the ceramic capacitor 224 and the interrupt wire 230 by the overcurrent may be transmitted through the insulation layer 221a and the common wire 227. As described above, the heat diffusion wire 240 is made of copper and has a higher thermal conductivity than the insulation layer 221a. Thus, when the heat by the overcurrent reaches the heat diffusion wire 240, the heat is diffused throughout the heat diffusion wire 240 before the heat is transmitted to other portion.

Specifically, the heat that reaches the outer wire layer 241 located adjacent to the interrupt wire 230 and the inner wire layer 243 located just under the interrupt wire 230 is transmitted to throughout the outer wire layer 241 and the inner wire layer 243. In addition, the heat is transmitted to the lower inner wire layer 243 and the outer wire layer 242 located on the lower side of the circuit substrate 221 via the through holes 244. Because the through holes 244 are filled with the filler 245, the heat by the overcurrent is rapidly transmitted through the filler 245 and the inner-wall wire 244a on the through holes 244. Accordingly, the heat is diffused throughout the heat diffusion wire 240 and is temporarily stored in the heat diffusion wire 240. Thus, the heat is less likely to be transmitted to the oscillator 222 and the electronic components 222a, 222b, which are located to an opposite side of the outer wire layer 241 from the interrupt wire 230.

As described above, in the traction control device 220 according to the present embodiment, the heat diffusion wire 240 is disposed on a heat transfer pathway from the interrupt wire 230 to the oscillator 222 and the electronic components 222a, 222b. Thus, the heat by the overcurrent can be diffused throughout the heat diffusion wire 240 with certainty before the heat reaches the oscillator 222 and the electronic components 222a, 222b, and the heat is less likely to be transmitted to the oscillator 222 and the electronic components 222a, 222b. Because the oscillator 222 is protected against the heat by the overcurrent by the heat diffusion wire 240, the whole circuit including the oscillator 222 can keep normal operation. In addition, because the heat is less likely to be transmitted to the lands 226a on which the oscillator 222 and the like is mounted, a failure of connection of the oscillator 222 and the like can be restricted.

In addition to the outer wire layer 241 located adjacent to the interrupt wire 230, the outer wire layer 242 located on the lower side of the circuit substrate 221 and the inner wire layers 243 are disposed so as to increase a heat capacity of the heat diffusion wire 240. Furthermore, by providing the through holes 244, the heat can be rapidly diffused throughout the heat diffusion wire 240 and can be stored in the heat diffusion wire 240. Thus, the heat is less likely to be transmitted to the oscillator 222. Because the inner wire layers 243 and the outer wire layer 242, which have larger surface areas than the outer wire layer 241, secure a large heat capacity of the heat diffusion wire 240, the heat can be diffused and stored in the heat diffusion wire 240 more effectively.

Because the through holes 244 are filled with the filler 245 and the heat can be transmitted between the wire layers effectively, the heat can be rapidly diffused throughout the four wire layers, and the heat transfer to the oscillator 222 and the like can be further restricted.

Because the inner wire 243 is disposed under the interrupt wire 230 and the ceramic capacitor 224, which are heat sources, in addition to the outer wire layer 241, the heat can be diffused throughout the heat diffusion wire 240 more rapidly and the heat transfer to the oscillator 222 and the like can be restricted more certainty.

As a result, failure, such as performance deterioration and life shortening, of the oscillator 222 and the electronic components 222a, 222b due to heat by an overcurrent can be restricted, and the circuit including the oscillator 222 and the electronic components 222a, 222b can keep normal operation. In the present embodiment, the oscillator 222 and the electronic components 222a, 222b are described as the protected electronic components. However, needless to say, all the electronic components mounted on the circuit substrate 221 other than the ceramic capacitor 224 are to be protected against heat by an overcurrent.

The filler 245 may be made of any material that transfers heat preferably. For example, the filler 245 may be a metal rod made of copper, aluminum, or silver, and the filler 245 may also be made of aluminum paste, silver paste, heat release gel, or ceramic. Each wire layer in the heat diffusion wire 240 may be made of any material having a preferable heat conductivity, such as aluminum and ceramic, in a manner similar to the filler 245.

The number and the arrangement of the through holes 244 and the shape and size of each wire layer in the heat diffusion wire 240 can be set optionally based on the arrangement of the electronic components and the other wires. The number of the inner wire layer 243 may be set optionally in accordance with the number of layers in the circuit substrate 221. The inner wire layer 243 may be omitted and the heat diffusion wire 240 may include only the outer wire layer 241.

(Seventh Embodiment)

A traction control device 220a according to a seventh embodiment of the present disclosure will be described with reference to FIG. 20 and FIG. 21.

The traction control device 220a includes an interrupt wire 230a and a heat diffusion wire 240a instead of the interrupt wire 230 and the heat diffusion wire 240 described in the sixth embodiment. The other configuration of the traction control device 220a is similar to the above-described configuration of the traction control device 220 according to the sixth embodiment. Thus, differences between the traction control device 220a according to the present embodiment and the traction control device 220 according to the sixth embodiment will be mainly described.

Figure 20:
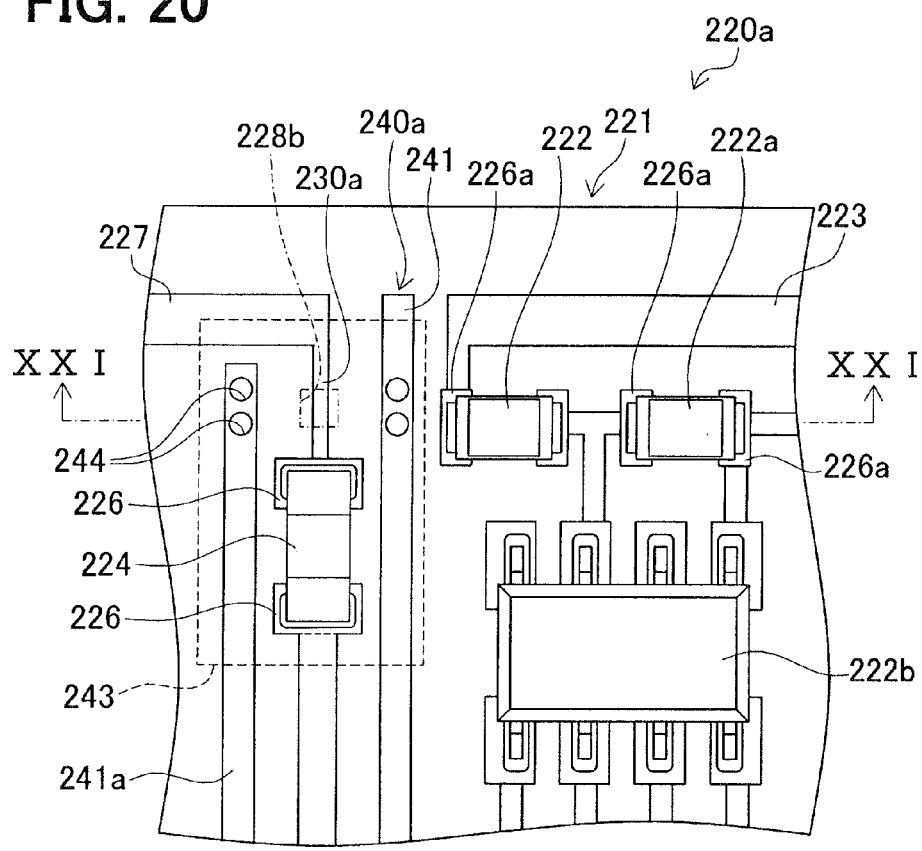
FIG. 20 is a diagram showing a part of a traction control device according to a seventh embodiment of the present disclosure.

As shown in FIG. 20, the interrupt wire 230a according to the present embodiment has a straight shape. One end portion of the interrupt wire 230a is coupled with an end portion of the common wire 227 at an approximately 90 degrees, and the other end portion of the interrupt wire 230a is coupled with the land 26 that is coupled with the ceramic capacitor 224.

The heat diffusion wire 240a according to the present embodiment includes an outer wire layer 241a in addition to the outer wire layer 241 on the upper side of the circuit substrate 221. The outer wire layer 241a has a configuration similar to the outer wire layer 241 and extends in parallel with the outer wire layer 241. The interrupt wire 230a and the ceramic capacitor 224 are located between the outer wire layer 241 and the outer wire layer 241a.

At an end portion of the outer wire layer 241a, a pair of through holes 244 is defined in a manner similar to the outer wire layer 241. As shown in FIG. 21, the outer wire layer 241a, the inner wire layers 243 and the outer wire layer 242 are thermally coupled with each other via the through holes 244. Accordingly, the interrupt wire 230a is surrounded by the outer wire layers 241, 241a, the four through holes 244, and the inner wire layer 243 located just under the interrupt wire 230a.

Figure 21:
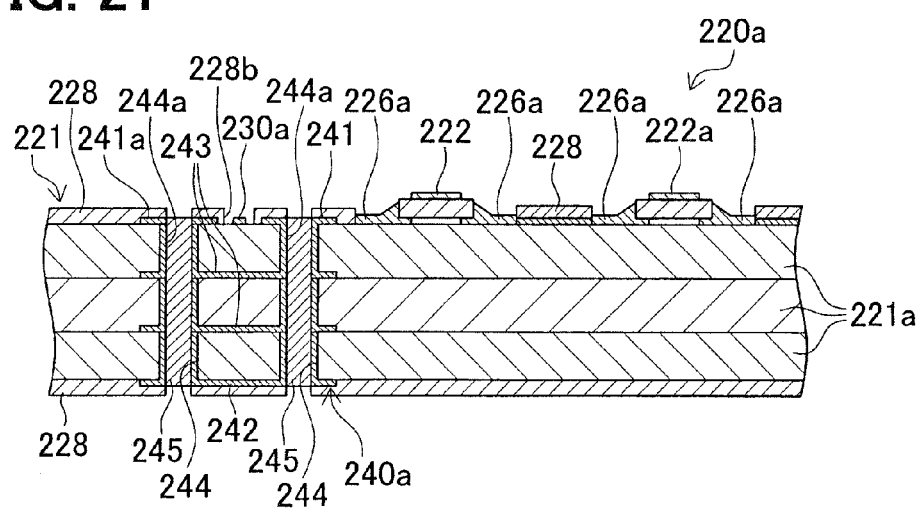
FIG. 21 is a cross-sectional view of the traction control device taken along line XXI-XXI in FIG. 20.

As shown in FIG. 21, the solder resist layer 228 defines an opening portion 228b having a rectangular shape so that at least a part of the interrupt wire 230a is exposed outside through the opening portion 228b. Specifically, the solder resist layer 228 defines the opening portion 228b so that a center portion of the entire length of the interrupt wire 230a, which is most likely to generate heat, is exposed outside.

Reasons of providing the opening portion 228b are similar to the reasons of providing the opening portion 28a, which is described in the fourth embodiment.

When at least a part of the interrupt wire 230a is exposed through the opening portion 228b, the melting time t decreases, the overcurrent protection action can be achieved early, and a temperature rise of a protected component can be restricted. Furthermore, a time for which a voltage of the common wire 227 decreases due to interruption by the interrupt wire 230a can be reduced. In addition, because the variation of the melting time t decreases, a capacity of a stabilizing capacitor that is designed in view of the melting time of the interrupt wire 230a in each device or each circuit can be reduced, and thereby a cost and a size can be reduced. Furthermore, because the melting time t decreases in a rated region of current, a circuit can be designed more freely. The other configuration is similar to the above-described configuration of the sixth embodiment.

In the traction control device 220a, heat by an overcurrent is rapidly diffused by the outer wire layers 241, 241a and the upper inner wire layer 243, which surround the interrupt wire 230a and the ceramic capacitor 224. In addition, the heat is transmitted to the lower inner wire layer 243 and the outer wire layer 242 via the four through holes 244, and thereby the heat is stored in the entire heat diffusion wire 240a before the heat is transmitted further away.

As described above, in the traction control device 220a according to the present embodiment, the outer wire layer 241a and the through holes 244 are provided to an opposite side of the interrupt wire 230a and the ceramic capacitor 224 from the outer wire layer 241 so as to surround the interrupt wire 230a and the ceramic capacitor 224. Accordingly, before heat by an overcurrent is transmitted to a surrounding region, the heat can be rapidly transmitted throughout the heat diffusion wire 240a more certainty and can be stored in the heat diffusion wire 240a. Thus, the protected electronic components, such as the oscillator 222, can keep normal operation with certainty.

In the present embodiment, a melt conductor generated by melting of the interrupt wire 230a flows from the opening portion 228b. Accordingly, the melt conductor is less likely to stay at a position of the interrupt wire 230a before melting, variations in the melt position and the melting time due to stay of the melt conductor can be restricted, and a decrease in interruption performance by the interrupt wire 230a can be restricted.

Furthermore, because the solder resist layer 228 defines the opening portion 228b so that the portion of the interrupt wire 230a that is most likely to generate heat is exposed outside, the opening portion 228b is defined at a portion corresponding to a portion of the interrupt wire 230a that is most likely to melt. Thus, a decrease in interruption performance by the interrupt wire 230a can be restricted with certainty.

(Eighth Embodiment)

A traction control device 220b according to an eighth embodiment of the present disclosure will be described with reference to FIG. 22 and FIG. 23.

The traction control device 220b according to the present embodiment includes an interrupt wire 230a, which is similar to the interrupt wire 230a according to the seventh embodiment, and a heat diffusion wire 240b. The other configuration of the traction control device 220b is similar to the above-described configuration of the traction control device 220 according to the sixth embodiment. Thus, differences between the traction control device 220b according to the present embodiment and the traction control device 220 according to the sixth embodiment will be mainly described.

Figure 22:
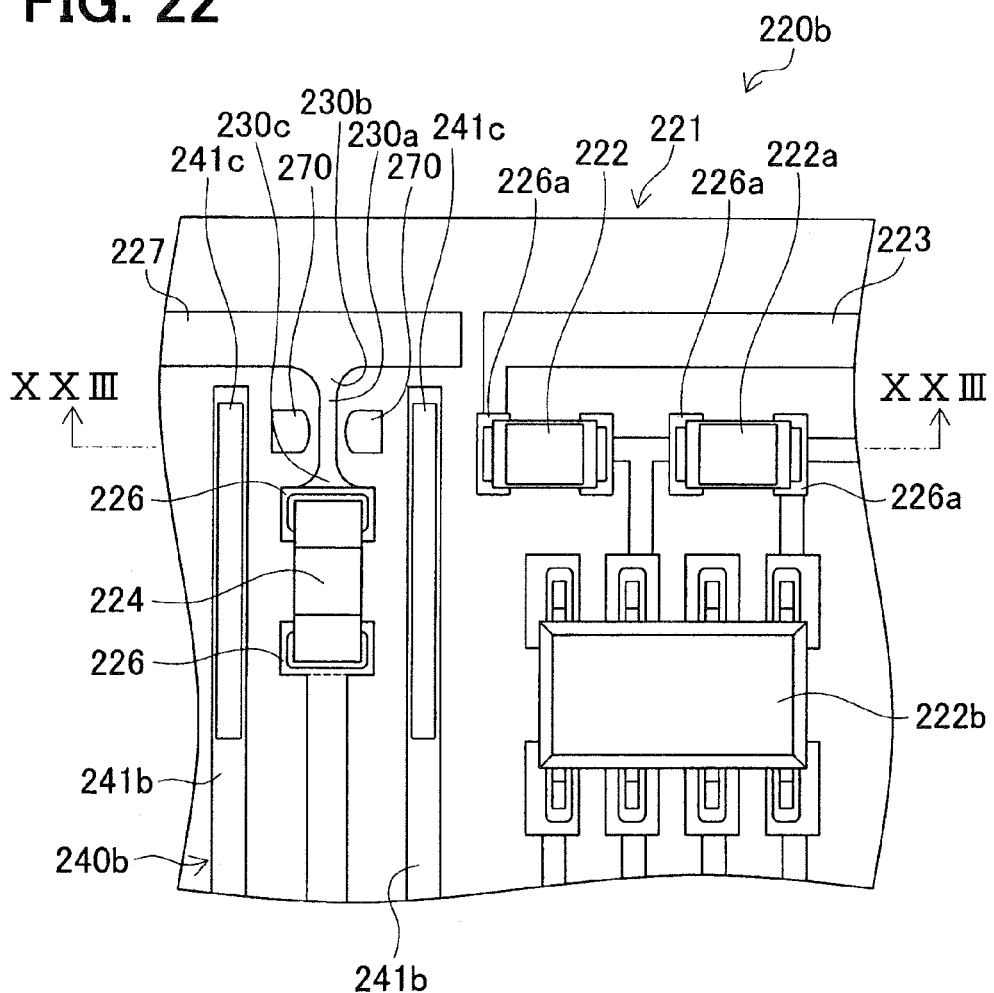
FIG. 22 is a diagram showing a part of a traction control device according to an eighth embodiment of the present disclosure.

As shown in FIG. 22, the interrupt wire 230a diverges from the common wire 227 and is coupled with the land 226 on which the ceramic capacitor 224 is mounted. The heat diffusion wire 240b includes a pair of outer wire layers 241 located on the upper side of the circuit substrate 221. The pair of outer wire layers 241 is disposed to opposite sides of the interrupt wire 230a and the ceramic capacitor 224 and extends in parallel with each other.

Figure 23:
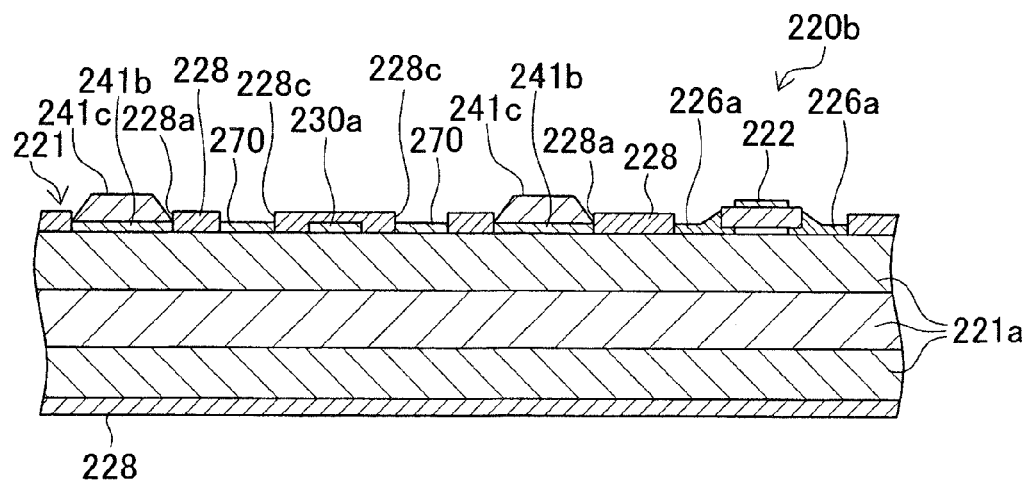
FIG. 23 is a cross-sectional view of the traction control device according to the eighth embodiment taken along line XXIII-XXIII in FIG. 23.

As shown in FIG. 23, the solder resist layer 228 located on the upper side of the circuit substrate 221 defines opening portions 228a. The opening portions 228a extend along the respective outer wire layers 241b to expose almost the whole surface of the corresponding outer wire layers 241b. On the part of outer wire layers 241b exposed through the opening portions 228a and located adjacent to the interrupt wire 230a and the ceramic capacitor 224, a solder 241c as a heat release member is disposed. The solder 241 c bulges from surfaces of the outer wire layers 241b. Due to the solder 241c, a total cross-sectional area and a total surface area of the outer wire layers 241b and the solder 241c increase compared with a case where only the outer wire layers 241b are disposed.

One end of the interrupt wire 230a is electrically coupled with the common wire 227 through a first connection wire 230b, and the other end of the interrupt wire 230a is electrically coupled with the land 226 through a second connection wire 230c. Each of the first connection wire 230b and the second connection wire 230c may be made of the same conductive material, such as copper, as the interrupt wire 230a and the common wire 227. Each of the first connection wire 230b and the second connection wire 230c has a larger conductor volume than the interrupt wire 230a.

Specifically, a wire width of the first connection wire 230b increases toward the common wire 227, which is a connection object, in an arc manner. In other words, the wire width of the first connection wire 230b increases toward the common wire 227 so that a cross-sectional area at an end of the first connection wire 230b coupled with the interrupt wire 230a is smaller than a cross-sectional area at the other end of the first connection wire 230b coupled with the common wire 227.

A wire width of the second connection wire 230c increases toward the land 226, which is a connection object, in an arc manner. In other words, the wire width of the second connection wire 230c increases toward the land 226 so that a cross-sectional area at an end of the second connection wire 230c coupled with the interrupt wire 230a is smaller than a cross-sectional area at the other end of the second connection wire 230c coupled with the land 226.

The traction control device 220b further includes a pair of adherent wires 270 to which a melt conductor generated by melting of the interrupt wire 230a adheres. The adherent wires 270 are disposed to opposite sides of the interrupt wires 230a. The adherent wires 270 are made of conductive material, such as copper, in a manner similar to the common wire 227. The solder resist layer 228 further defines opening portions 280c. Positions and shapes of the opening portions 280c correspond to the adherent wires 270 so as to expose the adherent wires 270 from the solder resist layer 228.

In the traction control device 220b, when heat by an overcurrent reaches the outer wire layers 241b disposed on the opposite sides of the ceramic capacitor 224 and the interrupt wire 230a, the heat is diffused throughout the outer wire layers 241b. Because the total cross-sectional area of outer wire layers 241b and the solder 241c increases compared with the case where only the outer wire layers 241b are disposed and the outer wire layers 241b and the solder 241c have high thermal conductivities, the heat by the overcurrent is rapidly diffused throughout the heat diffusion wire 240b and is stored in the heat diffusion wires 240b. Furthermore, because the outer wire layers 241b are exposed through the opening portions 228a, and the total surface area of the outer wire layers 241b and the solder 241c is increased by the solder 241c which bulges from the outer wire layers 241b, the stored heat is efficiently released from the outer wire layers 241b and the solder 241c.

As described above, in the traction control device 220b according to the present embodiment, because the total cross-sectional area of the outer wire layers 241b and the solder 241c increase, the heat by the overcurrent can be rapidly diffused throughout the heat diffusion wire 240b and can be stored in the heat diffusion wire 240b. In addition, because the total surface area of the outer wire layers 241b and the solder 241c increases, the heat is efficiently released from the outer wire layers 241b and the solder 241c. Thus, heat transfer to the protected electronic components, such as the oscillator 222, can be effectively restricted, and the protected electronic components can keep normal operation with certainty.

In the present embodiment, the heat diffusion wire 240b is provided only on the upper side of the circuit substrate 221. However, the heat diffusion wire 240b may further include inner wire layers and through holes that couple the outer wire layers 241b and the inner wire layers with each other in a manner similar to the sixth embodiment and the seventh embodiment. Accordingly, the heat capacity of the heat diffusion wire 240b increases, and the heat transfer to the protected electronic components can be further restricted.

Furthermore, in the traction control device 220b according to the present embodiment, the interrupt wire 230a is coupled with the common wire 227 via the first connection wire 230b and is coupled with the land 226 via the second connection wire 230c. Because the side end of the interrupt wire 230a and the side end of the connection wires 230b, 230c are smoothly connected with each other, when the interrupt wire 230a and the connection wires 230b, 230c are formed using etching liquid, the etching liquid can uniformly flow at connection portions of the side end of the interrupt wire 230a and the side end of the connection wires 230b, 230c. Accordingly, the etching liquid is less likely to stay at the connection portions and a variation in wire width of the interrupt wire can be restricted. Thus, the decrease in interrupt performance by the interrupt wire 230a can be restricted.

When the melt conductor of the high temperature is generated at melting of the interrupt wire 230a, the melt conductor flow on the surface of the circuit board 221 and adheres to the adherent wires 270 adjacent to the interrupt wire 230a. Accordingly, the melt conductor is held by the adherent wire 270 and loses flowability by releasing heat and being hardened. Thus, influence of the flow of the melt conductor on the other electronic components can be restricted.

(Ninth Embodiment)

A traction control device 220c according to a ninth embodiment of the present disclosure will be described with reference to FIG. 24. The traction control device 220c includes a heat diffusion wire 240c including an outer wire layer 241d. The outer wire layer 241d is coupled with the power supply wire 223, which is used as a common wire. The other configuration of the traction control device 220c is similar to the above-described configuration of the traction control device 220 according to the sixth embodiment. Thus, differences between the traction control device 220c according to the present embodiment and the traction control device 220 according to the sixth embodiment will be mainly described.

Figure 24:
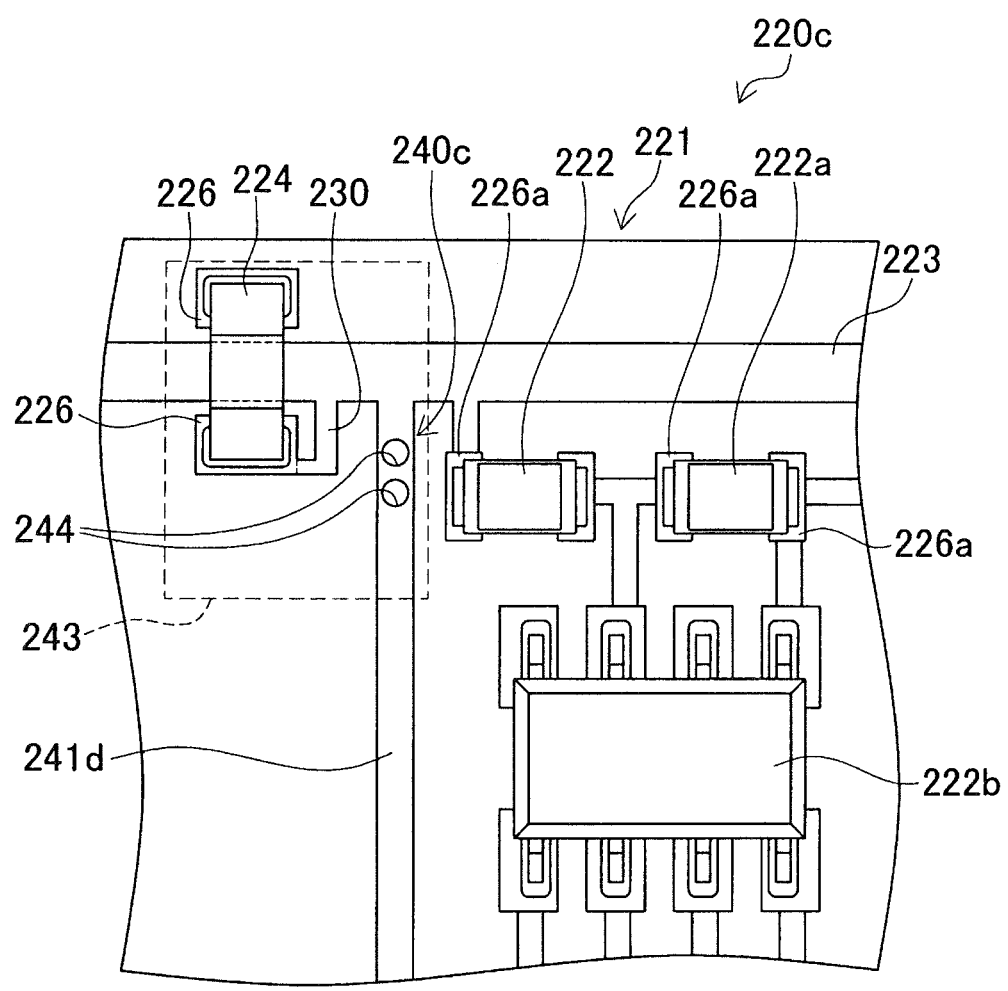
FIG. 24 is a diagram showing a part of a traction control device according to a ninth embodiment of the present disclosure.

As shown in FIG. 24, on the circuit substrate 221, the power supply wire 223, which supplies electric power from the battery 13, is electrically coupled with each electronic component, such as, the ceramic capacitor 224 and the oscillator 222. Thus, the power supply wire 223 can work as a common wire shared by the electronic components. The outer wire layer 241d of the heat diffusion wire 240c is disposed between the region where the interrupt wire 230 is disposed and a region where the oscillator 222 and the electronic components 222a, 222b are disposed. The outer wire layer 241d is coupled with the power supply wire 223. Accordingly, the heat diffusion wire 240c divides the interrupt wire 230 from the oscillator 222 and the electronic components 222a, 222b.

In the traction control device 220c, heat by an overcurrent is transmitted to the power supply wire 223 as well as the insulation layer 221a. A part of the heat transmitted to the power supply wire 223 is transmitted to the outer wire layer 241d, is diffused throughout the heat diffusion wire 240c, and is stored in the heat diffusion wire 240c. Thus, a heat transfer to the oscillator 222 and the electronic components 222a, 222b via the power supply wire 223 can be restricted.

The power supply wire 223 is coupled with the battery 13, which supplies power not only to the traction control device 220c but also to other electronic control devices 12, by the power supply path, and the fuse 14a for protecting the traction control device 220c and the other electronic control devices 12 is disposed on the power supply path. Even when a short-circuit fault occurs in the traction control device 220c including the interrupt wire 230, the interrupt wire 230 melts. Thus, influence of the short-circuit fault on the power supply to the other electronic control devices 12 can be restricted.

(Tenth Embodiment)

Figure 25:
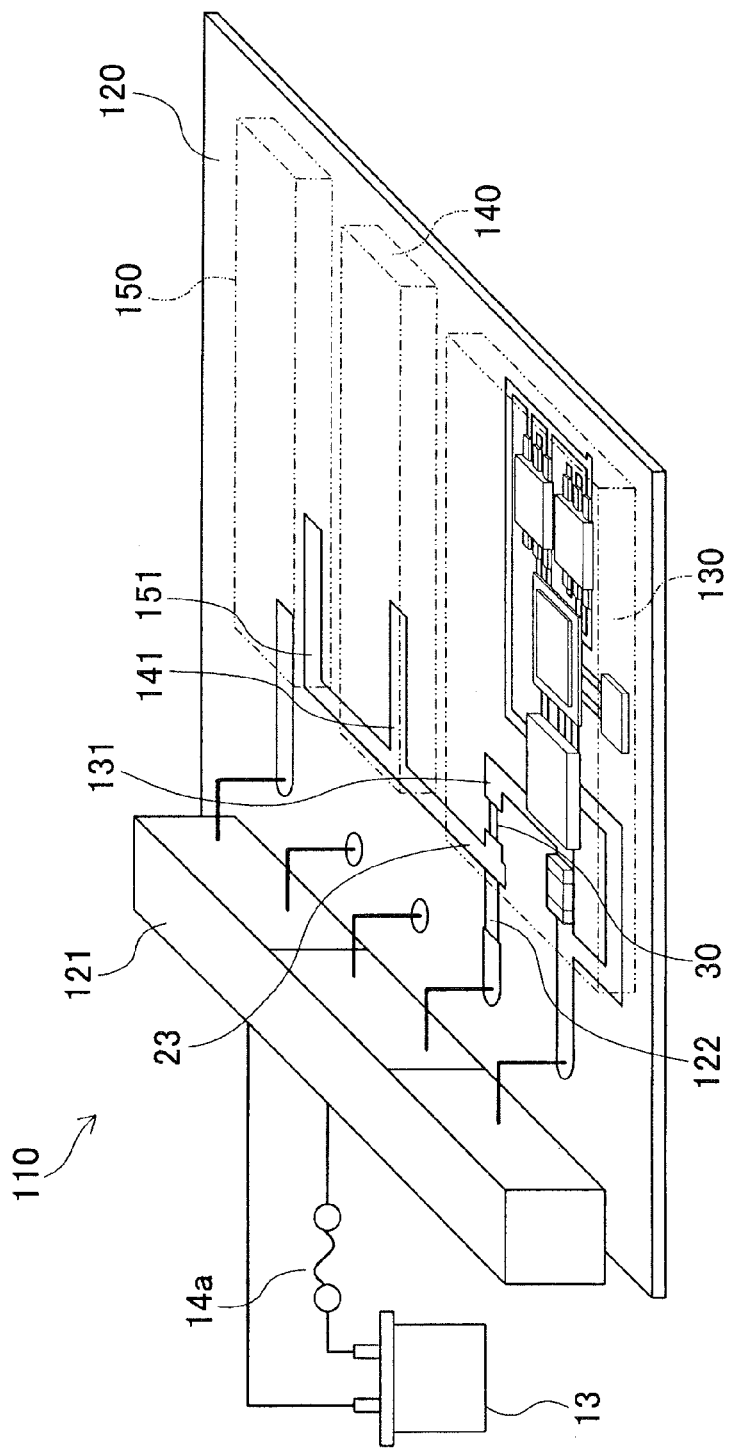
FIG. 25 is a diagram showing an electronic control device according to a tenth embodiment of the present disclosure.

An electronic control device 110 according to a tenth embodiment of the present disclosure will be described with reference to FIG. 25. The electronic control device 110 includes a substrate 120 and circuit blocks 130, 140, 150 disposed on the substrate 120. The circuit block 130 performs a similar function to the traction control device 20 according to the first embodiment. The circuit blocks 140, 150 perform different functions from the circuit block 130. The different functions are more important than the function of the circuit block 130. For example, the circuit block 140 performs a function corresponding to the engine ECU, and the circuit block 150 performs a function corresponding to the brake ECU.

The circuit blocks 130, 140, 150 are electrically coupled with the power supply wire 23, which supplies electric power from the battery 13, via branch wires 131, 141, 151, respectively. The above-described interrupt wire 30 is disposed on the branch wire 131 coupled with the circuit block 130 so as to function as overcurrent protection for the circuit block 130. On the power supply wire 23, an interrupt wire 122 that functions as overcurrent protection for the substrate 120 is disposed. In other words, the interrupt wire 122, which protects the substrate 120 including all the circuit blocks 130-150, and the interrupt wire 30, which protects the circuit block 130, are disposed on the substrate 120.

Accordingly, even when overcurrent is caused by a short-circuit fault in the circuit block 130 and the interrupt wire 30 melts due to the overcurrent, the circuit blocks 140, 150 are still electrically coupled with the power supply wire 23 via the branch wires 141, 151. Thus, only the circuit block 130 coupled with the melt interrupt wire 30 stops and the circuit blocks 140, 150 keep operating. In particular, since the function of the circuit block 130 is less important than the functions of the circuit blocks 140, 150, influence of the stop of the less important circuit block 130 on the functions of the more important circuit blocks 140, 150 can be restricted. When an overcurrent is caused by a short-circuit fault in the circuit blocks 140, 150 without the interrupt wire 30, the overcurrent flows to the power supply wire 23, the interrupt wire 122 melts, and the circuit blocks 130, 140, 150 are deactivated. Thus, the overcurrent is less likely to flow to other circuit block.

Especially in a case where a wire width of the interrupt wire 30 is smaller than a wire width of the interrupt wire 122 so that a current value at interruption by the interrupt wire 30 is smaller than a current value at interruption by the interrupt wire 122, when an overcurrent is caused by a short-circuit fault in the circuit block 130, the interrupt wire 30 melts earlier than the interrupt wire 122 with certainty. Thus, the influence on other circuit blocks 140, 150 can be restricted with certainty. The above-described configuration including two interrupt wires on one substrate may be applied to other embodiments and modifications.

(Other Embodiments)

The present invention is not limited to the above-described embodiments and the above-described modifications may include various changes and modifications. For example, each of the above-described interrupt wires 30, 30a-30e, to which the heat release portion (the heat release wire 40 or the heat release member 42) is disposed adjacent, may be electrically coupled with the common wire, which is shared by the electronic components 22 to be protected against overcurrent, instead of the power supply wire 23.

Each of the above-described interrupt wires 30, 30a-30e, to which the heat release portion (the heat release wire 40 or the heat release member 42) is disposed adjacent, may also be electrically coupled with a component-mounted wire, such as an internal layer fully covered with a protective layer made of, for example, solder resist.

Each of the above-described interrupt wires 30, 30a-30e, to which the heat release portion (the heat release wire 40 or the heat release member 42) is disposed adjacent, may be provided for each substrate for overcurrent protection of the electronic control devices 12 including the engine ECU, the brake ECU, the steering ECU, the body ECU, and the navigation ECU.

Each of the heat diffusion wires 240, 240a-240c in the traction control devices 220, 220a-220c described in the sixth to ninth embodiments may be provided for overcurrent protection of the electronic control devices 12 including the engine ECU, the brake ECU, the steering ECU, the body ECU, and the navigation ECU.

What is claimed is:
1. An electronic control device comprising:
a substrate;
a plurality of component-mounted wires disposed on the substrate;

a plurality of electronic components mounted on the respective component-mounted wires;
a common wire disposed on the substrate and coupled with each of the electronic components;
an interrupt wire coupled between one of the component-mounted wires and the common wire, the interrupt wire configured to melt in accordance with heat generated by an overcurrent so as to interrupt a connection between the one of the component-mounted wires and the common wire via the interrupt wire; and
a heat release portion attached to the common wire and made of the same material as the common wire, the heat release portion disposed at a position where a wiring distance from the interrupt wire is shorter than a wiring distance between the interrupt wire and any of the electronic components except for one of the electronic components mounted on the one of the component-mounted wires.

2. The electronic control device according to claim 1,
wherein the heat release portion includes a heat release wire disposed on the substrate so as to be adjacent to the common wire.

3. The electronic control device according to claim 1,
wherein the substrate includes a layer coupling portion, and
wherein the heat release portion includes a heat release member disposed inside the layer coupling portion.

4. The electronic control device according to claim 3,
wherein the substrate further includes another layer coupling portion, and
wherein the heat release member is disposed inside each of the layer coupling portions.

5. The electronic control device according to claim 3,
wherein the substrate has a first surface on which the common wire is disposed and a second surface opposite to the first surface,
wherein the heat release member includes a portion disposed inside the layer coupling portion and a portion disposed inside the substrate or disposed on the second surface, and
wherein the portions of the heat release member are in contact with each other.

6. The electronic control device according to claim 1,
wherein the interrupt wire is a first interrupt wire coupled with a first one of the component-mounted wires on which a first one of the electronic components is mounted,
wherein the heat release portion is a first heat release portion disposed at a position where a wiring distance from the first interrupt wire is shorter than a wiring distance between the first interrupt wire and any of the electronic components except for the first one of the electronic components,
the electronic control device further comprising:
a second interrupt wire coupled with a second one of the component-mounted wires on which a second one of the electronic components is mounted; and
a second heat release portion disposed at a position where a wiring distance from the second interrupt wire is shorter than a wiring distance between the second interrupt wire and any of the electronic components except for the second one of the electronic components.

7. The electronic control device according to claim 1,
wherein the interrupt wire is a first interrupt wire coupled with a first one of the component-mounted wires on which a first one of the electronic components is mounted, the electronic control device further comprising a second interrupt wire coupled with a second one of the component-mounted wires on which a second one of the electronic components is mounted,
wherein the heat release portion is disposed at a position where a wiring distance from each of the first interrupt wire and the second interrupt wire is shorter than a wiring distance between each of the first interrupt wire and the second interrupt wire and any of the electronic components except for the first one of the electronic components and the second one of the electronic components.

8. The electronic control device according to claim 1,
wherein the interrupt wire includes a first wire section and a second wire section that is shorter than the first wire section,
wherein the first wire section and the second wire section are coupled with each other at a predetermined angle, and
wherein the predetermined angle is determined so that one of the first wire section and the second wire section is coupled with the common wire and the other is coupled with the one of the component-mounted wires.

9. The electronic control device according to claim 1, further comprising
a protective layer covering a surface of the substrate including the interrupt wire, the protective layer defining an opening portion through which at least a part of the interrupt wire is exposed.

10. The electronic control device according to claim 1, further comprising
an adherent member disposed adjacent to the interrupt wire, the adherent member configured so that a melt conductor generated by melting of the interrupt wire adheres to the adherent member.

11. The electronic control device according to claim 1, further comprising
a connection wire via which the interrupt wire is coupled with a connection object that is one of the common wire and the one of the component-mounted wires,
wherein a side end of the connection wire is smoothly connected with a side end of the interrupt wire, and
wherein a wire width of the connection wire increases toward the connection object.

12. The electronic control device according to claim 1, wherein
the common wire is a power supply wire.

13. A control system comprising:
a power supply path coupled with a power source;
a fuse disposed on the power supply path;
a device coupled with the power source by the power supply path via the fuse; and
the electronic control device according to claim 12,
wherein the power supply wire in the electronic control device is coupled with the power source by the power supply path via the fuse.

14. An electronic control device comprising:
a substrate;
a wire disposed on the substrate;
an electronic component coupled with the wire;
an interrupt wire coupled between the electronic component and the wire,
the interrupt wire configured to melt in accordance with heat generated by an overcurrent so as to interrupt a connection between the electronic component and the wire via the interrupt wire;
a protected electronic component disposed on the substrate; and a heat diffusion wire disposed adjacent to the interrupt wire, the heat diffusion wire diffusing the heat by the overcurrent throughout the heat diffusion wire and storing the heat so as to protect the protected electronic component against the heat.

15. The electronic control device according to claim 14, wherein the heat diffusion wire is disposed between the interrupt wire and the protected electronic component.

16. The electronic control device according to claim 14, wherein the protected electronic component includes an oscillator.

17. The electronic control device according to claim 14, wherein the protected electronic component is mounted on a surface of the substrate.

18. The electronic control device according to claim 14, further comprising:
a protective layer covering a surface of the substrate and defining an opening portion through which at least a part of the heat diffusion wire is exposed; and
a heat release member disposed on the part of the heat diffusion wire exposed through the opening portion.

19. The electronic control device according to claim 18, wherein the heat release member includes a solder.

20. The electronic control device according to claim 14, wherein the substrate includes a plurality of layers,
wherein the heat diffusion wire includes a plurality of wire layers disposed on the respective layers of the substrate, and
wherein the heat diffusion wire defines a through hole via which the wire layers are thermally coupled.

21. electronic control device according to claim 20, wherein the heat diffusion wire further includes a filler disposed inside the through hole to increase a heat-transfer efficiency between the wire layers in the heat diffusion wire.

22. The electronic control device according to claim 20, wherein the protected electronic component is mounted on a surface of the substrate, wherein the wire layers include an outer wire layer disposed on the surface of the substrate and an inner wire layer disposed inside the substrate, and
wherein a surface area of the inner wire layer is larger than a surface area of the outer wire layer.

23. The electronic control device according to claim 22, wherein the inner wire layer is disposed in such a manner that at least a part of the inner wire layer overlap the interrupt wire in a thickness direction of the substrate.

24. The electronic control device according to claim 22, wherein the inner wire layer is disposed in such a manner that at least a part of the inner wire layer overlap the electronic component in a thickness direction of the substrate.

25. The electronic control device according to claim 14, wherein the wire includes a power supply wire that is coupled with the electronic component and the protected electronic component.

26. A control system comprising:
a power supply path coupled with a power source;
a fuse disposed on the power supply path;
a device coupled with the power source by the power supply path via the fuse; and
the electronic control device according to claim 25,
wherein the power supply wire in the electronic control device is coupled with the power source by the power supply path via the fuse.

* * * * *